(12) United States Patent
Fu et al.

(10) Patent No.: US 10,990,012 B2
(45) Date of Patent: Apr. 27, 2021

(54) SILSESQUIOXANE RESIN AND OXAAMINE COMPOSITION

(71) Applicant: Dow Silicones Corporation, Midland, MI (US)

(72) Inventors: Peng-Fei Fu, Midland, MI (US); Wonbum Jang, Cheongju (KR)

(73) Assignee: Dow Silicones Corporation, Midland, MI (US)

( * ) Notice: Subject to any disclaimer, the term of this patent is extended or adjusted under 35 U.S.C. 154(b) by 192 days.

(21) Appl. No.: 16/092,463

(22) PCT Filed: Apr. 27, 2017

(86) PCT No.: PCT/US2017/029775
§ 371 (c)(1),
(2) Date: Oct. 10, 2018

(87) PCT Pub. No.: WO2017/192345
PCT Pub. Date: Nov. 9, 2017

(65) Prior Publication Data
US 2019/0171106 A1 Jun. 6, 2019

Related U.S. Application Data

(60) Provisional application No. 62/330,914, filed on May 3, 2016.

(51) Int. Cl.
*G03F 7/075* (2006.01)
*C08K 5/17* (2006.01)
(Continued)

(52) U.S. Cl.
CPC .............. *G03F 7/0757* (2013.01); *C07F 7/21* (2013.01); *C08G 77/045* (2013.01); *C08K 5/04* (2013.01);
(Continued)

(58) Field of Classification Search
CPC .......... G03F 7/075; G03F 7/0757; C07F 7/21; C08G 77/045
See application file for complete search history.

(56) References Cited

U.S. PATENT DOCUMENTS

| 4,189,323 A | 2/1980 | Bur |
| 6,040,112 A | 3/2000 | Yako et al. |

(Continued)

FOREIGN PATENT DOCUMENTS

| CN | 101974119 | 2/2011 |
| JP | 2007113266 | 5/2007 |

(Continued)

OTHER PUBLICATIONS

Machine translation of JP 2007-133266 (no date).*
(Continued)

*Primary Examiner* — Amanda C. Walke

(57) ABSTRACT

A silsesquioxane-containing composition comprising a silsesquioxane resin and an oxaamine of formula (II) (see description), products prepared therefrom, photoresist compositions comprising the silsesquioxane-containing composition and a photoacid generator, products prepared therefrom, methods of making and using same, and manufactured articles and semiconductor devices containing same.

14 Claims, 6 Drawing Sheets

(51) Int. Cl.

| | | |
|---|---|---|
| *C08L 83/06* | (2006.01) | |
| *C07F 7/21* | (2006.01) | |
| *C08K 5/04* | (2006.01) | |
| *C08G 77/04* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |
| *H01L 21/027* | (2006.01) | |
| *C08G 77/14* | (2006.01) | |
| *C08G 77/00* | (2006.01) | |

(52) U.S. Cl.
CPC .............. *C08K 5/17* (2013.01); *C08L 83/06* (2013.01); *G03F 7/162* (2013.01); *G03F 7/168* (2013.01); *G03F 7/2002* (2013.01); *G03F 7/2004* (2013.01); *G03F 7/2037* (2013.01); *G03F 7/2039* (2013.01); *G03F 7/322* (2013.01); *G03F 7/38* (2013.01); *H01L 21/0274* (2013.01); *C08G 77/14* (2013.01); *C08G 77/70* (2013.01)

(56) References Cited

U.S. PATENT DOCUMENTS

| | | |
|---|---|---|
| 6,270,941 B1 | 8/2001 | Yasunami |
| 6,645,692 B2 | 11/2003 | Namba |
| 6,846,895 B2 | 1/2005 | Iwasawa et al. |
| 6,855,476 B2 | 2/2005 | Ferreira et al. |
| 6,916,593 B2 | 7/2005 | Hatakeyama et al. |
| 7,049,052 B2 | 5/2006 | Xiao et al. |
| 7,261,992 B2 | 8/2007 | Sooriyakumaran et al. |
| 7,276,324 B2 | 10/2007 | Watanabe et al. |
| 7,390,608 B2 | 6/2008 | Barclay et al. |
| 7,625,687 B2 | 12/2009 | Hu et al. |
| 7,824,836 B2 | 11/2010 | Tsubaki |
| 8,088,547 B2 | 1/2012 | Hu et al. |
| 8,148,043 B2 | 4/2012 | Hu et al. |
| 8,198,016 B2* | 6/2012 | Hatakeyama ......... G03F 7/2024 430/312 |
| 8,216,763 B2 | 7/2012 | Sato et al. |
| 8,524,439 B2 | 9/2013 | Hu et al. |
| 8,728,335 B2 | 5/2014 | Fu et al. |
| 8,729,148 B2 | 5/2014 | Asai et al. |
| 8,784,947 B2* | 7/2014 | Nagai ................. C09D 143/04 427/515 |
| 9,006,373 B2* | 4/2015 | Brock ............... H01L 21/76802 528/41 |
| 9,765,246 B2* | 9/2017 | Kageyama ............... G02B 6/36 |
| 2002/0098443 A1* | 7/2002 | Hatakeyama ......... G03F 7/0382 430/270.1 |
| 2004/0024156 A1 | 2/2004 | Quadir et al. |
| 2006/0003252 A1 | 1/2006 | Hirayama et al. |
| 2009/0202941 A1* | 8/2009 | Hu ........................ C08G 77/38 430/271.1 |
| 2011/0143092 A1 | 6/2011 | Asai et al. |
| 2015/0301452 A1 | 10/2015 | Park et al. |
| 2017/0073557 A1 | 3/2017 | Kageyama et al. |
| 2018/0282485 A1* | 10/2018 | Kuwana ................ C08G 77/14 |

FOREIGN PATENT DOCUMENTS

| | | |
|---|---|---|
| JP | 2007133266 A * | 5/2007 |
| JP | 5791144 | 11/2012 |
| WO | 2008001782 | 1/2008 |
| WO | 2015019767 | 2/2015 |

OTHER PUBLICATIONS

A. Charlesby., "Effect of Weight on the Cross-linking of Siloxanes by High-energy Radiation." Atomic Research Establishment. Nature 173, pp. 679-680.

Nagahara et al. "Understanding quencher mechanisms by considering photoacid-dissociation equilibrium in chemically-amplified resists" Dept. of EECS, Univ. of California.

Muller, et al.; Photocrosslinking of Silicones—5.; European Polymer Journal, vol. 27, Issue 7, 1991, pp. 621-625.

Palsule, et al.; Journal of Inorganic and Organometallic Polymers and Materials, Jun. 2008, vol. 18, Issue 2, pp. 207-221.

Report from corresponding China 201780027283.0 application, dated Jun. 11, 2020.

Report from corresponding Korea 10-2018-7033366 application, dated Feb. 28, 2020.

Report from corresponding Korea 10-2018-7033366 application, dated Oct. 28, 2020.

Report from corresponding Japan 12018-557410 application, dated Jan. 5, 2021.

* cited by examiner (Non-invention)

SILSESQUIOXANE RESIN AND OXAAMINE COMPOSITION

TECHNICAL FIELD

This invention generally relates to a silsesquioxane-containing composition comprising a silsesquioxane resin and an oxaamine, products prepared therefrom, photoresist compositions comprising the silsesquioxane-containing composition and a photoacid generator, products prepared therefrom, methods of making and using same, and manufactured articles and semiconductor devices containing same.

BACKGROUND OF THE RELATED ART

Critical features of many opto/electronic devices include patterns or integrated circuits (ICs). Patterns and ICs may be made by transferring a pattern from a photoresist layer to a substrate such as a semiconductor material or an electrically conductive metal. The photoresist layer comprises a photoresist composition comprising a light-sensitive material. The pattern in the photoresist layer is formed using photolithography with ultraviolet (UV) light and transferred using etching.

In order to make new opto/electronic devices more powerful, smaller and faster, these patterns or ICs must be manufactured in smaller and finer feature sizes (finer resolutions). One way to enable finer pattern resolutions is to use shorter wavelengths of light. Trends are shortening the wavelength from 365 nanometers (nm) to 248 nm (KrF) to 193 nm (ArF). Eventually wavelengths may be 157 nm (F2) and/or extreme ultraviolet light (EUV) at 13 nm. A photoresist composition that is useful at a particular wavelength, however, may fail to react at shorter wavelengths. Another way is to form a multilayer resist instead of a single layer resist. As patterns become finer and thus pattern aspect ratios become greater, single layer resists are at risk of collapse. For a given thickness of a photoresist layer, a multilayer resist may enable patterns with higher aspect ratios. Still another way is to formulate a photoresist composition to be chemically amplifiable, which helps counteract weaker responses at shorter wavelengths of light. Typically, a combination of these ways is used.

A chemically-amplifiable photoresist composition comprises a photoresist polymer that is acid sensitive and a small amount of a photoacid generator. The acid-sensitive photoresist polymer comprises macromolecular chains that bear pendant acid-sensitive groups, sometimes called acid dissociable groups, acid cleavable groups, or acid labile groups. The photoacid generator (PAG) itself is not an acid, but the PAG is a compound that absorbs light of a certain wavelength and produces a product acid in situ. Some chemically-amplifiable photoresist compositions may be further formulated with one or more optional additives that enhance desired properties or inhibit undesired properties of the composition. Examples of such additives are an acid-cleavable dissolution inhibitor, a crosslinking agent (e.g., in negative photoresist compositions), a solvent, a dye, a sensitizer, a stabilizer (e.g., shelf-life stabilizer), an acid-diffusion controlling agent, a coating aid such as a surfactant or an anti-foaming agent, an adhesion promoter, and a plasticizer.

A variety of incumbent chemically-amplifiable photoresist compositions are known. Some are based on organic polymers comprising acid-sensitive groups. Others are based on organosiloxane polymers comprising acid-sensitive groups. Not all incumbent compositions enable use of shorter wavelengths of light or produce satisfactory patterns.

Incumbent silsesquioxane resins with acid cleavable groups are mentioned in U.S. Pat. No. 7,261,992 B2 to R. Soorlyakumaran, et al. ("SOORLYAKUMARAN"). SOORLYAKUMARAN mentions, among other things, fluorocarbinol- and/or fluoroacid-functionalized silsesquioxane polymers and copolymers for use in lithographic photoresist compositions. SOORLYAKUMARAN also mention a composition wherein the fluorocarbinol- and/or fluoroacid-functionalized silsesquioxane polymer is a copolymer of a fluorocarbinol-functionalized silsesquioxane monomer and a silsesquioxane monomer substituted with an acid cleavable group. The composition may further comprise additives such as an acid-cleavable dissolution inhibitor, a crosslinking agents, a solvent, dyes, sensitizers, additives used as stabilizers and acid-diffusion controlling agents, coating aids such as surfactants or anti-foaming agents, adhesion promoters, and plasticizers. Examples of the additives used as stabilizers and acid-diffusion controlling agents are compounds with varying basicity. These may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others.

Incumbent silsesquioxane resins with acid cleavable groups are described in U.S. Pat. No. 7,625,687 B2 to S. Hu, et al. ("HU1"); U.S. Pat. No. 8,088,547 B2 to S. Hu, et al. ("HU2"); U.S. Pat. No. 8,148,043 B2 to S. Hu, et al. ("HU3"); and U.S. Pat. No. 8,524,439 B2 to S. Hu, et al. ("HU4"). HU1, HU2, HU3, and HU4 independently describe, among other things, a silsesquioxane resin that contains $(HSiO_{3/2})$ units and $(RSiO_{3/2})$ units wherein R is an acid dissociable group. The acid dissociable group (R) can be described by the formula $—(R^3)_g\text{-L-}(R^3)_h—C(R^5)(R^6)—(R^4)_kZ$ or the general formula $—(R^3)_f\text{-L-}(R^3)_g—C(R^5)(R^6)—(R^4)_hZ$. HU3 also mentions a silsesquioxane-based composition comprising the silsesquioxane resin and an organic base additive selected from bulky tertiary amines, imides, amides and polymeric amines. The organic base additive contains an electron-attracting group with the provision that the organic base is not 7-diethylamino-4-methylcoumarin. Some of the organic base additives contain an oxo (=O) group. The composition of HU4 includes 7-diethylamino-4-methylcoumarin. Other additives may be used in the photoresist composition, including one or more of solvents, acid generators, surfactants, dissolution inhibitors, cross-linking agents, sensitizers, halation inhibitors, adhesion promoters, storage stabilizers, anti-foaming agents, coating aids, plasticizers and others.

Some incumbent resins face challenges to achieving satisfactory structural features and performance. For example, most incumbent silsesquioxane resins have low thermal stability (i.e., low glass transition temperatures, $T_g$). They also are difficult to configure with other properties including fine pattern resolution, high light sensitivity, and wide process latitude (tolerance for changing process conditions). Some incumbent silsesquioxane resins outgas during UV light exposure (e.g., at 193 nm). Some incumbent composition contain additives that hurt their performance.

BRIEF SUMMARY OF THE INVENTION

Ideally a resist image has vertical features with desirable straight sides. The straight vertical sides may define holes or trenches (e.g., Π_Π) in a resist layer. The result is a vertical feature having a cross-section profile that beneficially is I-shaped with curved corner tops or squared corner tops (II). We discovered, however, that incumbent photoresist compositions containing certain incumbent amine additives produce resist images having vertical features with cross-section profiles having undesirable overhangs or rims at the top. The result is a vertical feature having a cross-section profile that is T-shaped (TT). T-shaped cross-section profiles are formed when developer dissolves less material at the top of the vertical feature than at the bottom of the vertical feature. Etching a resist image having vertical features with T-shaped cross-section profiles with rimed tops is less effective at transferring the resist image to the underlying substrate than is etching a resist image having I-shaped cross-section profiled vertical features with curved corner tops or squared corner tops.

Without being bound by theory, we believe resist images having vertical features with T-shaped cross-section profiles are formed when a surface region of a mask exposed (mask irradiated) portion of the resist layer becomes less soluble or slower to dissolve in developer (e.g., aqueous base) than deeper regions of the masked-irradiated portion of the resist layer. We think that surface-located incumbent amine, upon receiving high energy or shorter wavelength radiation, somehow facilitates this change in solubility or dissolution kinetics at the surface of the resist layer, while the incumbent amine at greater depths in the resist layer has no or less affect. For example, perhaps the incumbent amine facilitates some crosslinking of silicone resin at the surface of the resist layer.

We have discovered a silsesquioxane-containing composition comprising a silsesquioxane resin and an oxaamine of formula (II) (described later) solve one or more of the aforementioned problems such as the T-shaped cross-section profile problem. Embodiments of the present invention include the silsesquioxane-containing composition, products prepared therefrom, photoresist compositions comprising the silsesquioxane-containing composition and a photoacid generator, products prepared therefrom, methods of making and using same, and manufactured articles and semiconductor devices containing same. The silsesquioxane-containing composition may be used to prepare the photoresist composition. The photoresist composition may be used as a layer of a single layer photoresist or as a layer of multilayer photoresist, both in a method of photolithographic patterning. The silsesquioxane-containing composition may also be used in other light related applications other than photolithography such as anti-reflective coatings or optical encapsulants. The silsesquioxane-containing composition may also be used in "dark" applications that do not employ light such as adhesives, coatings, and sealants. The silsesquioxane-containing composition may be used to make manufactured articles for non-electronics applications and the composition may be used in non-electronic articles and devices.

BRIEF DESCRIPTION OF DRAWINGS

Certain embodiments of the present invention are illustrated in the accompanying drawings. The drawings preserve same numbers for same elements and features.

DETAILED DESCRIPTION OF THE INVENTION

Figure 1:
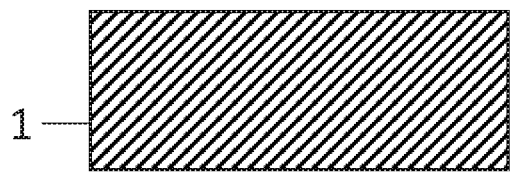
FIG. 1 (FIG. 1) is an elevation view of a substrate embodiment.

The Brief Summary and Abstract are incorporated here by reference. This invention is described herein in an illustrative manner by disclosing a plurality of representative, non-limiting embodiments and examples.

The silsesquioxane-containing composition comprises (A) a silsesquioxane resin of formula (I), described later, and (B) an oxaamine of formula (II), described later. The silsesquioxane-containing composition may consist of constituents (A) and (B) (i.e., 0 optional constituents), or may comprise constituents (A), (B), and 1, 2, 3, or more optional constituents described later (e.g., (C) a photoacid generator and/or (D) a solvent). The silsesquioxane-containing composition may be prepared by mixing together constituents (A) and (B), and, if desired, any optional constituents. The silsesquioxane-containing composition may be prepared as a 1-part formulation or a multiple part formulation such as a 2-part formulation. The 1-part formulation may appeal to end-users having cold and/or dark storage capacity and/or end-users who wish to avoid mixing multiple parts together just prior to use. The multipart formulation such as the 2-part formulation may appeal to end-users who lack cold and/or dark storage capacity and/or end-users who wish to mix the multiple parts together just prior to use.

The photoresist composition comprises the (A) silsesquioxane resin of formula (I), (B) oxaamine of formula (II), and (C) a photoacid generator. The molar amount of the (B) oxaamine of formula (II) may be less than the molar amount of the (C) photoacid generator in the photoresist composition. The photoresist composition may consist of constituents (A), (B) and (C) (i.e., 0 optional constituents), or may comprise constituents (A), (B), (C), and 1, 2, 3, or more optional constituents described later (e.g., (D) a solvent). The photoresist composition may be prepared by together mixing constituents (A), (B), (C), and any optional constituents. Alternatively, the photoresist composition may be prepared by mixing the silsesquioxane-containing composition, constituent (C), and any optional constituents. The photoresist composition may be prepared as a 1-part formulation or a multiple part formulation such as a 2-part formulation.

The silsesquioxane-containing composition and the photoresist composition independently may be prepared as a manufactured article comprising the silsesquioxane-containing composition or the photoresist composition, respectively. The preparing may comprise shaping the respective composition.

The silsesquioxane-containing composition and the photoresist composition may be used in an opto/electronic device comprising an opto/electronic component and the silsesquioxane-containing composition or the photoresist composition, respectively. The opto/electronic component may be an optical component, an electronic component, or a combination optical and electronic component. The silsesquioxane-containing composition and the photoresist composition may be disposed in direct or indirect contact with the opto/electronic component.

Some embodiments of the invention include the following numbered aspects.

Aspect 1. A silsesquioxane-containing composition comprising (A) a silsesquioxane resin and (B) an oxaamine, wherein: the (A) silsesquioxane resin is of formula (I):

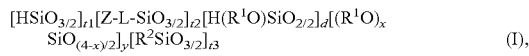

$$[HSiO_{3/2}]_{t1}[Z-L-SiO_{3/2}]_{t2}[H(R^1O)SiO_{2/2}]_d[(R^1O)_x SiO_{(4-x)/2}]_y[R^2SiO_{3/2}]_{t3} \quad (I),$$

wherein: subscript t1 is a mole fraction of from 0.4 to 0.9; subscript t2 is a mole fraction of from 0.1 to 0.6; subscript d is a mole fraction from 0 to 0.45; subscript x is an integer of 1, 2, or 3; subscript y is a mole fraction from 0 to 0.25; subscript t3 is a mole fraction from 0 to 0.15; the sum of t1+t2=from ≥0.9 to ≤1 and the sum of t1+t2+d+y+t3=1; each $R^1$ is independently H or $(C_1-C_6)$alkyl; each $R^2$ is independently HO-L- or HOOC-L-; each L is independently a divalent $(C_1-C_{20})$hydrocarbon group that is unsubstituted or substituted with at least 1 substituent independently selected from $(C_1-C_3)$alkyl, —OH, and a fluorine atom up to and including perfluoro-substitution; and each Z is —OH, —COOH, —O-THP, —OCH($R^{3a}$)$_2$, —OC($R^{3b}$)$_3$, —COOCH($R^{3a}$)$_2$, —COOC($R^{3b}$)$_3$, —OCOOCH($R^{3a}$)$_2$, or —OCOOC($R^{3b}$)$_3$, wherein THP is tetrahydropyran-2-yl; wherein each $R^{3a}$ is independently a $(C_1-C_6)$alkyl, $(C_3-C_{12})$cycloalkyl, $(C_6-C_{10})$aralkyl, $((C_1-C_6)$alkyl)3SiCH2CH2-, or 2 $R^{3a}$ together with the carbon atom to which they are both bonded are a $(C_3-C_{12})$cycloalkyl or a $(C_6-C_{12})$bicycloalkyl; and wherein each $R^{3b}$ is independently a $(C_1-C_6)$alkyl, $(C_3-C_{12})$cycloalkyl, $(C_6-C_{10})$aralkyl, $((C_1-C_6)$alkyl)3SiCH2CH2-; or 2 $R^{3b}$ together with the carbon atom to which they are both bonded are a $(C_3-C_{12})$cycloalkyl or a $(C_6-C_{12})$bicycloalkyl and the remaining $R^{3b}$ is independently a $(C_1-C_6)$alkyl, $(C_3-C_{12})$cycloalkyl, $(C_6-C_{10})$aralkyl, or $((C_1-C_6)$alkyl)3SiCH2CH2-; or all 3 $R^{3b}$ together with the carbon atom to which they are all bonded are a $(C_7-C_{12})$bicycloalkyl; and the (B) oxaamine is of formula (II):

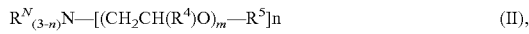

$$R^N_{(3-n)}N-[(CH_2CH(R^4)O)_m-R^5]n \quad (II),$$

wherein: subscript m is an integer from 1 to 10; subscript n is an integer 1, 2, or 3; each $R^N$ is independently unsubstituted $(C_1-C_{12})$alkyl; each $R^4$ is independently H or an unsubstituted $(C_1-C_{12})$alkyl; and each $R^5$ is independently H or a $(C_1-C_{12})$alkyl, which is unsubstituted or independently substituted with 1, 2, or 3 $(C_1-C_{12})$alkoxy groups.

Aspect 2. The silsesquioxane-containing composition of aspect 1 wherein in the (A) silsesquioxane resin: subscript t1 is a mole fraction of from 0.4 to 0.65; subscript t1 is a mole fraction of from 0.65 to 0.9; subscript t2 is a mole fraction of from 0.1 to 0.35; subscript t2 is a mole fraction of from 0.5 to 0.6; subscript d is 0; subscript d is a mole fraction from >0 to 0.45; subscript x is 1; subscript x is 2; subscript x is 3; subscript y is 0; subscript y is a mole fraction from >0 to 0.25; subscript t3 is 0; subscript t3 is a mole fraction from >0 to 0.15; at least one $R^1$ is H; subscript d is a mole fraction from >0 to 0.45 or subscript y is a mole fraction from >0 to 0.25 and at least one $R^1$ is H; at least one $R^1$ is independently $(C_1-C_6)$alkyl; subscript d is a mole fraction from >0 to 0.45 or subscript y is a mole fraction from >0 to 0.25 and at least one $R^1$ is $(C_1-C_6)$alkyl; at least one $R^2$ is independently HO-L-; subscript t3 is a mole fraction from >0 to 0.15 and at least one $R^2$ is independently HO-L-; at least one $R^2$ is independently HOOC-L-; subscript t3 is a mole fraction from >0 to 0.15 and at least one $R^2$ is independently HOOC-L-; at least one L is independently a divalent $(C_1-C_{20})$hydrocarbon group that is unsubstituted; at least one L is independently a divalent $(C_6-C_{10})$bicycloalkane group that is unsubstituted; at least one L is a divalent $(C_1-C_{20})$hydrocarbon group that is substituted with at least 1 $(C_1-C_3)$alkyl group; at least one L is a divalent $(C_6-C_{10})$bicycloalkane group that is substituted with at least 1 $(C_1-C_3)$alkyl group; at least one L is a divalent $(C_1-C_{20})$hydrocarbon group that is substituted with at least 1 —OH group; at least one L is a divalent $(C_6-C_{10})$bicycloalkane group that is substituted with at least 1 —OH group; at least one L is independently a divalent $(C_1-C_{20})$hydrocarbon group that is substituted with at least 1 fluorine atom up to and including perfluoro-substitution; at least one L is independently a divalent $(C_6-C_{10})$bicycloalkane group that is substituted with at least 1 fluorine atom up to and including perfluoro-substitution; at least one Z is —OH; at least one Z is —COOH; at least one Z is —O-THP; at least one Z is —OCH($R^{3a}$)$_2$; at least one Z is —COOCH($R^{3a}$)$_2$; at least one Z is —OCOOCH($R^{3a}$)$_2$; at least one Z is —OC($R^{3b}$)$_3$; at least one Z is —COOC($R^{3b}$)$_3$; at least one Z is —OCOOC($R^{3b}$)$_3$; at least one $R^{3a}$ or $R^{3b}$ is independently a $(C_1-C_6)$alkyl; at least one $R^{3a}$ or $R^{3b}$ is independently $(C_3-C_{12})$cycloalkyl; at least one $R^{3a}$ or $R^{3b}$ is independently $(C_6-C_{10})$aralkyl; at least one $R^{3a}$ or $R^{3b}$ is independently $((C_1-C_6)$alkyl)3SiCH2CH2-; 2 $R^{3a}$ or 2 $R^{3b}$ together with the carbon atom to which they are both bonded are a $(C_3-C_{12})$cycloalkyl or a $(C_6-C_12)$bicycloalkyl; or all 3 $R^{3b}$ together with the carbon atom to which they are all bonded are a $(C_7-C_{12})$bicycloalkyl.

Aspect 3. The silsesquioxane-containing composition of aspect 1 or 2 wherein in the (A) silsesquioxane resin of formula (I) the Z-L- is selected from the following monovalent carboxylic esters: a bicyclo[2.2.1]heptane-5-yl-2-carboxylic acid, secondary aliphatic ester; a bicyclo[2.2.1]heptane-5-yl-2-carboxylic acid, tertiary aliphatic ester; a bicyclo[2.2.1]heptane-6-yl-2-carboxylic acid, secondary aliphatic ester; or a bicyclo[2.2.1]heptane-6-yl-2-carboxylic acid, tertiary aliphatic ester.

Aspect 4. The silsesquioxane-containing composition of aspect 3 wherein Z-L- is selected from the following monovalent carboxylic esters: bicyclo[2.2.1]heptane-5-yl-2-carboxylic acid, 1',1'-dimethylethyl ester; bicyclo[2.2.1]heptane-6-yl-2-carboxylic acid, 1',1'-dimethylethyl ester; bicyclo[2.2.1]heptane-5-yl-2-carboxylic acid, 1'-methylethyl ester; bicyclo[2.2.1]heptane-6-yl-2-carboxylic acid, 1'-methylethyl ester; bicyclo[2.2.1]heptane-5-yl-2-carboxylic acid, adaman-1'-yl ester; bicyclo[2.2.1]heptane-6-yl-2-carboxylic acid, adaman-1'-yl ester; bicyclo[2.2.1]heptane-5-yl-2-carboxylic acid, 3'-methyladaman-1'-yl ester; bicyclo[2.2.1]heptane-6-yl-2-carboxylic acid, 3'-methyladaman-1'-yl ester; bicyclo[2.2.1]heptane-5-yl-2-carboxylic acid, 2'-methyladaman-2'-yl ester; bicyclo[2.2.1]heptane-6-yl-2-carboxylic acid, 2'-methyladaman-2'-yl ester; bicyclo[2.2.1]heptane-5-yl-2-carboxylic acid, 2'-ethyladaman-2'-yl ester; bicyclo[2.2.1]heptane-6-yl-2-carboxylic acid, 2'-ethyladaman-2'-yl ester; bicyclo[2.2.1]heptane-5-yl-2-carboxylic acid, cyclohexyl ester; bicyclo[2.2.1]heptane-6-yl-2-carboxylic acid, cyclohexyl ester; bicyclo[2.2.1]heptane-5-yl-2-carboxylic acid, 1'-ethylcyclopentyl ester; bicyclo[2.2.1]heptane-6-yl-2-carboxylic acid, 1'-ethylcyclopentyl ester; bicyclo[2.2.1]heptane-5-yl-2-carboxylic acid, 2'-hydroxy-2',6',6'-trimethylbicyclo[3.1.1]heptane-3'-yl ester; and bicyclo[2.2.1]heptane-6-yl-2-carboxylic acid, 2'-hydroxy-2',6',6'-trimethylbicyclo[3.1.1]heptane-3'-yl ester.

Aspect 5. The silsesquioxane-containing composition of any one of aspects 1 to 4 wherein the (A) silsesquioxane resin of formula (I) has a weight average molecular weight ($M_w$) of 1,000 to 50,000.

Aspect 6. The silsesquioxane-containing composition of any one of aspects 1 to 5 wherein in the (B) oxaamine of formula (II): subscript m is an integer from 1 to 5.5; subscript m is an integer from 5.5 to 10; subscript n is 1; subscript n is 2; subscript n is 3; n is 1 or 2 and $R^N$ is unsubstituted $(C_1-C_4)$alkyl; at least one $R^4$ is independently H; at least one $R^4$ is independently an unsubstituted $(C_1-C_{12})$alkyl; at least one $R^5$ is independently H; at least one $R^5$ is independently a $(C_1-C_{12})$alkyl, which is unsubstituted; at least one $R^4$ and $R^5$ is independently an unsubstituted $(C_1-C_5)$alkyl; at least one $R^4$ and $R^5$ is independently an unsubstituted $(C_6-C_{12})$alkyl; at least one $R^5$ is independently a $(C_1-C_{12})$alkyl, which is independently substituted with 1, 2, or 3 $(C_1-C_{12})$alkoxy groups; at least one $R^5$ is independently a $(C_1-C_{12})$alkyl, which is independently substituted with 1 $(C_1-C_{12})$alkoxy group; at least one $R^5$ is independently a $(C_1-C_5)$alkyl, which is independently substituted with 1 $(C_1-C_5)$alkoxy group; at least one $R^5$ is independently a $(C_1-C_{12})$alkyl, which is independently substituted with 2 $(C_1-C_{12})$alkoxy groups; at least one $R^5$ is independently a $(C_1-C_{12})$alkyl, which is independently substituted with 3 $(C_1-C_{12})$alkoxy groups; at least one $R^5$ is independently a $(C_1-C_5)$alkyl, which is independently substituted with 1, 2, or 3 $(C_1-C_5)$alkoxy groups; or at least one $R^5$ is independently a $(C_1-C_5)$alkyl, which is independently substituted with 1, 2, or 3 $(C_6-C_{12})$alkoxy groups.

Aspect 7. The silsesquioxane-containing composition of any one of aspects 1 to 5 wherein the (B) oxaamine of formula (II) is selected from: tri(2-(ethyloxy)ethyl)-amine; tri(1-methyl-ethanol-2-yl)-amine; tri(2-(3'-methylbutyloxy)ethyl)-amine; tri(2-(hexyloxy)ethyl)-amine; tri(2-(octyloxy)ethyl)-amine; tri(2-(methoxymethoxy)ethyl)-amine; tri(2-(methoxyethoxy)ethyl)-amine; tri(2-(2'-ethoxyethoxy)ethyl)-amine; and tri(2-(2'-(2''-methoxyethoxy)ethoxy)ethyl)-amine. Alternatively, the silsesquioxane-containing composition of any one of aspects 1 to 5 wherein the (B) oxaamine of formula (II) is selected from: ethyl-di(2-(ethyloxy)ethyl)-amine; ethyl-di(1-methyl-ethanol-2-yl)-amine; ethyl-di(2-(3'-methylbutyloxy)ethyl)-amine; ethyl-di(2-(hexyloxy)ethyl)-amine; ethyl-di(2-(octyloxy)ethyl)-amine; ethyl-di(2-(methoxymethoxy)ethyl)-amine; ethyl-di(2-(methoxyethoxy)ethyl)-amine; ethyl-di(2-(2'-ethoxyethoxy)ethyl)-amine; and ethyl-di(2-(2'-(2''-methoxyethoxy)ethoxy)ethyl)-amine. Alternatively, the silsesquioxane-containing composition of any one of aspects 1 to 5 wherein the (B) oxaamine of formula (II) is selected from: dimethyl-(2-(ethyloxy)ethyl)-amine; dimethyl-(1-methyl-ethanol-2-yl)-amine; dimethyl-(2-(3'-methylbutyloxy)ethyl)-amine; dimethyl-(2-(hexyloxy)ethyl)-amine; dimethyl-(2-(octyloxy)ethyl)-amine; dimethyl-(2-(methoxymethoxy)ethyl)-amine; dimethyl-(2-(methoxyethoxy)ethyl)-amine; dimethyl-(2-(2'-ethoxyethoxy)ethyl)-amine; and dimethyl-(2-(2'-(2''-methoxyethoxy)ethoxy)ethyl)-amine.

Aspect 8. A silsesquioxane-containing composition comprising the silsesquioxane-containing composition of any one of aspects 1 to 7 and (C) a photoacid generator.

Aspect 9. The silsesquioxane-containing composition of aspect 8, wherein the (C) photoacid generator comprises an onium salt, a halogen-containing compound, a diazoketone compound, a sulfone compound, a sulfonate compound, or a combination of any two or more thereof.

Aspect 10. The silsesquioxane-containing composition of any one of aspects 1 to 9 independently further comprising one or more constituents (additives): (D) a solvent, (E) an adhesion promoter, (F) a dye, (G) a halation inhibitor, (H) a plasticizer, (I) a sensitizer, (J) a stabilizer (e.g., storage stabilizer), and (K) a surfactant. In some embodiments the silsesquioxane-containing composition does not contain constituents (D) to (K). In some embodiments the silsesquioxane-containing composition further comprises the (D) solvent, the (E) adhesion promoter, or both (D) and (E).

Aspect 11. A manufactured article comprising the silsesquioxane-containing composition of any one of aspects 1 to 10.

Aspect 12. A method of making a resist image on a substrate, the method comprising: applying the silsesquioxane-containing composition of any one of aspects 1 to 10 to a surface of a substrate so as to form an applied film thereof on the surface of the substrate, wherein the silsesquioxane-containing composition comprises the (A) silsesquioxane resin, the (B) oxaamine, and (C) a photoacid generator; mask exposing the applied film to radiation to produce an exposed film containing a latent pattern; developing the exposed film to produce a resist image from the latent pattern to give a manufactured article comprising the resist image disposed on the substrate. The substrate may be any article that can receive the silsesquioxane-containing composition and support the applied film thereof. E.g., the substrate may be a semiconductor wafer or an underlayer (e.g., a hardmask or anti-reflective coating). The underlayer may be freestanding or disposed on a semiconductor wafer.

Aspect 13. The method of making a resist image on a substrate of aspect 12, wherein: the substrate comprises a bare semiconductor wafer; the substrate comprises a primed semiconductor wafer; the substrate comprises a primed semiconductor wafer prepared by priming a bare semiconductor wafer with hexamethyldisilazane; the substrate comprises a semiconductor wafer and the silsesquioxane-containing composition is applied directly on a surface of the semiconductor wafer; the substrate comprises a semiconductor wafer having a surface portion comprising silicon carbide, silicon carbonitride, silicon nitride, silicon oxide, silicon oxynitride, or silicon oxycarbonitride, and the silsesquioxane-containing composition is applied directly on the surface portion of the semiconductor wafer; the substrate comprises an underlayer (e.g., 2 in FIG. 2), such as an antireflective coating (ARC) or a hardmask layer, disposed on a surface of a semiconductor wafer (e.g., 1 in FIG. 2) and the silsesquioxane-containing composition is applied directly on the underlayer (e.g., ARC or the hardmask layer) without being applied directly on the semiconductor wafer (e.g., as in FIG. 3); before the applying step the silsesquioxane-containing composition further comprises (D) a solvent and the applying step comprises spin-coating; the applied film further comprises (D) a solvent and the method further comprises drying the applied film (soft baking) before the mask exposing step; the applied film has a thickness of from 0.01 to 5 micrometers; the radiation is selected from ultraviolet (UV) light, X-ray radiation, e-beam radiation, and extreme ultraviolet (EUV) radiation; the radiation has a wavelength in a range of from 13 nanometers (nm) to 365 nm; the radiation has a wavelength comprising 365 nm, 248 nm, 193 nm, 157 nm, or 13 nm; the developing step comprises contacting the mask exposed film (e.g., 3 in FIG. 4) with a developer comprising an aqueous base; the method further comprises heating the mask exposed film at a temperature from 30 degrees Celsius (° C.) to 200° C. and cooling the mask exposed film before the developing step and the developing step comprises contacting the cooled mask exposed film with a developer comprising an aqueous base; or the developing step comprises contacting the mask exposed film with a developer comprising aqueous tetramethylammonium hydroxide. The radiation wavelength may comprise 248 nm or 193 nm.

Aspect 14. The method of making a resist image on a substrate of aspect 12 or 13, wherein: the substrate comprises a hardmask layer disposed on a surface of a semiconductor wafer and the silsesquioxane-containing composition is applied directly on the hardmask layer without being applied directly on the semiconductor wafer and the method further comprises oxygen ($O_2$) plasma etching the resist image to etch the hardmask layer by transferring the resist image into the hardmask layer and give a first semiconductor device comprising a bilayer image disposed on the surface of the semiconductor wafer, wherein the bilayer image comprises a resist image layer and a hardmask image layer, and wherein a region of the surface of the semiconductor wafer is covered by the bilayer image and another region of the surface of the semiconductor wafer is uncovered (e.g., as in FIG. 6); or the substrate comprises a hardmask layer disposed on a surface of a semiconductor wafer and the silsesquioxane-containing composition is applied directly on the hardmask layer without being applied directly on the semiconductor wafer and the method further comprises: (i) oxygen ($O_2$) plasma etching the resist image to etch the hardmask layer by transferring the resist image into the hardmask layer to give a first semiconductor device sequentially comprising a bilayer image disposed on the surface of the semiconductor wafer, wherein the bilayer image comprises a resist image layer and a hardmask image layer, and wherein a region of the surface of the semiconductor wafer is covered by the bilayer image and another region of the surface of the semiconductor wafer is uncovered (e.g., as in FIG. 6); and (ii) halogen etching the uncovered region of the surface of the semiconductor wafer of the first semiconductor device to transfer the bilayer image into the semiconductor wafer by removing the remaining applied film, at least some of the hardmask layer, and some, but not all, of the uncovered region of the semiconductor wafer to give a second semiconductor device comprising a semiconductor image disposed on a basal semiconductor layer. E.g., as in FIG. 7 wherein all of the applied film, some of the hardmask layer, and some, but not all, of the uncovered region of the semiconductor wafer are removed; or as in FIG. 8 wherein all of the applied film, all of the hardmask layer, and some, but not all, of the uncovered region of the semiconductor wafer are removed.

Aspect 15. A semiconductor device comprising the first or second semiconductor device made by the method of aspect 14.

Aspect 16. The semiconductor device of aspect 15 comprising the second semiconductor device wherein the semiconductor image of the second semiconductor device has an aspect ratio greater than 5, a rectangular profile, or both.

We present a technical solution to one or more of the aforementioned problems of prior art photoresists. Embodiments of our invention yield resist images having vertical features having I-shaped cross-section profiles, thereby solving the problem of T-shaped cross-section profiles of vertical features in incumbent resist images with incumbent amines.

Figure 10:
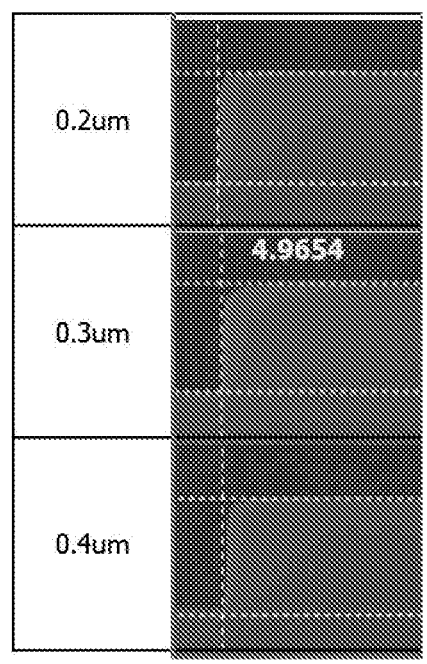
FIG. 10 is a series of black-and-white photographs of resist image line cross-section profiles of an inventive resist image embodiment.
Figure 11:
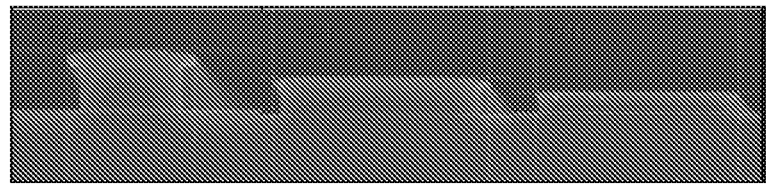
FIG. 11 (non-invention) is a series of black-and-white photographs of resist image line cross-section profiles of a non-invention resist image.

The technical solution may enable photopatterning using light having a wavelength of 248 nm, alternatively 197 nm, alternatively 157 nm, alternatively 13 nm. Examples of vertical features having I-shaped cross-section profiles in inventive positive resist images are illustrated in FIG. 10. Examples of vertical features having T-shaped cross-section profiles in non-invention resist images are illustrated in FIG. 11 (non-invention).

Without being bound by theory, we believe that the oxaamine of formula (II) has a low-energy conformation wherein the nitrogen atom and an oxygen atom are able to form an intramolecular hydrogen bond and produce a stable complex. Thus, when the silsesquioxane-containing resin composition such as the photoresist composition is exposed to high intensity radiation and produces an acid product of the PAG, a stable intramolecular hydrogen bonded complex may form comprising the oxaamine of formula (II) and the acid product. The intramolecular hydrogen bonded complex may tie up the amine/acid product and thereby prevent the oxaamine of formula (II) from facilitating crosslinking of the silsesquioxane resin of formula (I) at the surface of the resist layer. In this way the T-cross-section profiled lines of the resist pattern are avoided.

In contrast, incumbent non-invention amines physically cannot form stable intramolecular hydrogen bonded complexes, and thus incumbent amines can facilitate crosslinking of silsesquioxane resin at the surface of the non-invention resist layer. For example, non-invention amines such as simple amines (free of oxygen atoms) lack an oxygen atom required for the intramolecular hydrogen bonded complex. Non-invention amines such as morpholines cannot form a low-energy conformation where the N and O atoms can H-bond to the same H atom. Non-invention amines such as oxo-substituted amines may be unable to form a low-energy conformation where the N and O atoms can H-bond to the same H atom. Alternatively, the oxo may lack a sufficiently basic oxygen atom to form a stable complex. Thus, we believe that incumbent non-invention amines facilitate, or at least cannot prevent, formation of T-cross-section profiled lines in positive resists.

Embodiments of the silsesquioxane-containing composition, including photoresist compositions comprising the (A) silsesquioxane resin of formula (I), the (B) oxaamine of formula (II), and (C) a photoacid generator, may be optically transparent at wavelengths from 13 nm to 365 nm such as 13 nm, 157 nm, 193 nm, or 248 nm. The embodiments may also have adhesion to a semiconductor material or underlayer material such as an ARC or hardcoat material. The embodiments may also be thermally stable, for example if heated in absence of light and from 30° to 250° C. for from 1 to 120 minutes. The embodiments further comprising the (C) photoacid generator are chemically amplifiable during exposure to radiation. The resulting radiation exposed embodiments may be developable in aqueous base such as aqueous tetramethylammonium hydroxide ($TMAH_{aq}$) such as 2.5 wt % $TMAH_{aq}$.

Unless otherwise defined herein, meanings of chemical technology terms used herein may be found in IUPAC. Compendium of Chemical Terminology, 2nd ed. (the "Gold Book"). Compiled by A. D. McNaught and A. Wilkinson. Blackwell Scientific Publications, Oxford (1997). XML on-line corrected version: http://goldbook.iupac.org (2006-) created by M. Nic, J. Jirat, B. Kosata; updates compiled by A. Jenkins. ISBN 0-9678550-9-8. doi:10.1351/goldbook. Terms not defined by IUPAC may be defined in Hawley's CONDENSED CHEMICAL DICTIONARY, 11$^{th}$ edition, N. Irving Sax & Richard J. Lewis, Sr., 1987 (Van Nostrand Reinhold).

Unless otherwise defined herein, meanings of general terms used herein may be found here. Alternatively precedes a distinct embodiment. Articles "a", "an", and "the" each refer to one or more. Average molecular mass of a polymer such as weight average molecular mass or "$M_w$" is determined using gel permeation chromatography (GPC) with polystyrene standards. Chemical element or atom, a Group or Groups of chemical elements shall mean those published by IUPAC in the Periodic Table of the Elements, version dated 1 May 2013. Any comparative example is used for illustration purposes only and shall not mean prior art. Cured product such as a cured organosiloxane may have a structure that can be varied depending upon the particular reactants and curing conditions used to make it. That variability is not unlimited, but is restricted according to the structure of the reactants and curing chemistry and conditions. An example of the invention may be relied upon and provides adequate support for amending claims. Formulation, one-part, means a mixture containing all the constituents and in proportions needed to produce a cured product. The one-part formulation may use external factors such as moisture (for condensation curing), heat (for addition curing), or light (for addition curing) to initiate, speed or complete the curing process. Formulation, two-part, means a system that segregates different reactive constituents into two separate and complementary divisions to prevent premature initiation of curing. For example, a monomer or prepolymer, but not a catalyst, may be included in a primary part; and a cure catalyst, but not a monomer or prepolymer, may be included in a secondary part. Initiation of curing is achieved by combining the primary part and the secondary part together to form a one-part formulation. "Free of" or "lacks" means a complete absence of; alternatively not detectable, e.g., using nuclear magnetic resonance (NMR) spectroscopy (e.g., $^1$H-NMR, $^{13}$C-NMR, or $^{29}$Si-NMR) or Fourier Transform-Infrared (FT-IR) spectroscopy. Invention and inventive shall mean a representative embodiment or aspect, and shall not be interpreted as the entire inventive scope. IUPAC is International Union of Pure and Applied Chemistry (IUPAC Secretariat, Research Triangle Park, N.C., USA). Markush group comprises a genus of two or more members. A Markush group of members A and B may be equivalently expressed as: "a member selected from A and B"; "a member selected from the group consisting of A and B"; or "a member A or B". Each member may independently be a subgenus or species of the genus and may be relied upon individually or collectively in amending claims. May confers a permitted choice, not an imperative. Operative means functionally capable or effective. Optional(ly) means is absent (or excluded), alternatively is present (or included). Properties are measured using a standard test method and conditions for measuring (e.g., viscosity: 23° C. and 101.3 kPa). Ranges of numbers include endpoints, subranges, and whole and/or fractional values subsumed therein, except a range of integers does not include fractional values. Any stated number may be relied upon and provides adequate support for amending claims. Substituted means having, in place of hydrogen, one or more substituents, including per substitution. Each substituent may independently be a halogen atom, —NH$_2$, —NHR, —NR$_2$, —NO$_2$, —OH, —OR, oxo (=O), —C≡N, —C(=O)—R, —OC(=O)R, —C(=O)OH, —C(=O)OR, —SH, —SR, —SSH, —SSR, —SC(=O)R, —SO$_2$R, —OSO$_2$R, —SiR$_3$, or —Si(OR)$_3$; wherein each R independently is an unsubstituted (C$_1$-C$_{30}$)hydrocarbyl, alternatively (C$_1$-C$_6$)hydrocarbyl. Halogen atom is F, Cl, Br, or I; alternatively F, Cl, or Br; alternatively F or Cl; alternatively F; alternatively Cl. "Vehicle" means a liquid acting as a carrier, dispersant, diluent, storage medium, supernatant, or solvent for another material.

Any compound herein includes all its "isotopic forms", including natural abundance forms and isotopically-enriched forms. In some aspects, the isotopic form is the natural abundance form, alternatively the isotopically-enriched form. The isotopically-enriched forms may have additional uses, such as medical research or anti-counterfeiting applications, wherein detection of the isotopically-enriched compound is helpful in treatment or detection.

In some aspects any composition described herein may contain any one or more of the chemical elements of Groups 1 to 18 of the Periodic Table of the Elements, unless that chemical element has been specifically excluded. Specifically excluded chemical elements may be: (i) at least one chemical element from any one of Groups 2 to 13 and 18, including the lanthanoids and actinoids; (ii) at least one chemical element from any one of the third to sixth rows of the Periodic Table of the Elements, including the lanthanoids and actinoids; or (iii) both (i) and (ii), except not excluding Si, O, H, C, N, F, Cl, Br, or I.

As used herein the term "curved corner top" when referring to a line of a cross-section profile of a resist pattern or image means the profile has a horizontal uppermost surface (horizontal top surface such as "—"), a left side surface that is vertical ("|") or upwardly sloped (e.g., "/"), a right side surface that is vertical ("|") or downwardly sloped (e.g., "\"), an upwardly tapered transition (upwardly curved corner e.g., ⌐), and a downwardly tapered transition (downwardly curved corner, e.g., ¬. The curved corner top profile is illustrated by each of the images in FIG. 10. The upwardly tapered transition joins the left side surface to the horizontal top surface. The downwardly tapered transition joins the horizontal top surface to the right side surface. The left and right side surfaces are spaced apart from each other by a width of the line.

As used herein, the term "squared corner top" when referring to a line of a cross-section profile of a resist pattern or image means the profile has the above-mentioned horizontal uppermost surface (horizontal top surface), the above-mentioned left and right side surfaces, and one or two right-angled corners as transitions. The squared corner top profile is illustrated by the following shapes: ⌐ (one right-angled corner (left) and one curved corner (right)) and ∏ (two right-angled corners).

As used herein, the term "T-top" when referring to a line of a cross-section profile of a resist pattern or image means the profile has the above-mentioned horizontal uppermost surface (horizontal top surface), the above-mentioned left and right side surfaces, wherein the horizontal uppermost surface extends beyond the left and right side surfaces such that the line has an upper rim and the T-top profile is as illustrated by the following shape: π. (Note: in case of accidental re-fonting, the immediately preceding symbol is intended to be an upper case pi-symbol in Calibri font, 18 point).

Additional invention embodiments described below.

(A) Silsesquioxane Resin of Formula (I):

The (A) silsesquioxane resin is of formula (I):

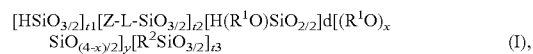

(I), wherein: subscript t1 is a mole fraction of from 0.4 to 0.9; subscript t2 is a mole fraction of from 0.1 to 0.6; subscript d is a mole fraction from 0 to 0.45; subscript x is an integer of 1, 2, or 3; subscript y is a mole fraction from 0 to 0.25; subscript t3 is a mole fraction from 0 to 0.15; the sum of t1+t2=from ≥0.9 to ≤1 and the sum of t1+t2+d+y+t3=1; each $R^1$ is independently H or $(C_1-C_6)$alkyl; each $R^2$ is independently HO-L- or HOOC-L-; each L is independently a divalent $(C_1-C_{20})$hydrocarbon group that is unsubstituted or substituted with at least 1 substituent independently selected from $(C_1-C_3)$alkyl, —OH, and a fluorine atom up to and including perfluoro-substitution; and each Z is —OH, —COOH, —O-THP, —OCH$(R^{3a})_2$, —OC$(R^{3b})_3$, —COOCH$(R^{3a})_2$, —COOC$(R^{3b})_3$, —OCOOCH$(R^{3a})_2$, or —OCOOC$(R^{3b})_3$, wherein THP is tetrahydropyran-2-yl; wherein each $R^{3a}$ is independently a $(C_1-C_6)$alkyl, $(C_3-C_{12})$cycloalkyl, $(C_6-C_{10})$aralkyl, $((C_1-C_6)$alkyl)3SiCH2CH2-, or 2 $R^{3a}$ together with the carbon atom to which they are both bonded are a $(C_3-C_{12})$cycloalkyl or a $(C_6-C_{12})$bicycloalkyl; and wherein each $R^{3b}$ is independently a $(C_1-C_6)$alkyl, $(C_3-C_{12})$cycloalkyl, $(C_6-C_{10})$aralkyl, $((C_1-C_6)$alkyl)3SiCH2CH2-; or 2 $R^{3b}$ together with the carbon atom to which they are both bonded are a $(C_3-C_{12})$cycloalkyl or a $(C_6-C_{12})$bicycloalkyl and the remaining $R^{3b}$ is independently a $(C_1-C_6)$alkyl, $(C_3-C_{12})$cycloalkyl, $(C_6-C_{10})$aralkyl, or $((C_1-C_6)$alkyl)3SiCH2CH2-; or all 3 $R^{3b}$ together with the carbon atom to which they are all bonded are a $(C_7-C_{12})$ bicycloalkyl. In some embodiments any one of subscripts t1, t2, d, x, y, and t2 and functional groups Z, L, $R^1$, and $R^2$ is as defined above in a dependent numbered aspect. In some embodiments the (A) silsesquioxane resin is the silsesquioxane resin 1 of the working examples described later.

(B) Oxaamine:

The (B) oxaamine is of formula (II):

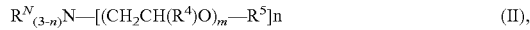

$$R^N_{(3-n)}N—[(CH_2CH(R^4)O)_m—R^5]n \qquad (II),$$

wherein: subscript m is an integer from 1 to 10; subscript n is an integer 1, 2, or 3; each $R^N$ is independently unsubstituted $(C_1-C_{12})$alkyl; each $R^4$ is independently H or an unsubstituted $(C_1-C_{12})$alkyl; and each $R^5$ is independently H or a $(C_1-C_{12})$alkyl, which is unsubstituted or independently substituted with 1, 2, or 3 $(C_1-C_{12})$alkoxy groups. In some embodiments any one of subscripts m and n and groups $R^N$, $R^4$ and $R^5$ is as defined above in a dependent numbered aspect. In some embodiments subscript n is 1. In some embodiments subscript n is 2. In some embodiments subscript n is 3. In some embodiments the (B) oxaamine is the oxaamine of aspect 7 described earlier. In some embodiments the (B) oxaamine is the oxaamine (B-1), (B-2), (B-3), or (B-4) of the working examples described later.

The (B) oxaamine is typically present in the silsesquioxane-containing composition at a concentration from 0.01 part to 5 parts, alternatively from 0.05 part to 4 parts, alternatively from 0.07 part to 3 parts, alternatively from 0.09 part to 2 parts, all per 100 parts of the (A) silsesquioxane resin.

(C) Photoacid Generator (PAG).

The photoresist composition comprises one or more (C) photoacid generator. The (C) photoacid generator ("PAG") comprises any compound that is not an acid (not a Brønsted or Lewis acid), but that generates an acid upon exposure to electromagnetic radiation. Thus, a PAG functions as a pro-acid, which is a compound that undergoes a photochemical transformation before exhibiting acidic effects. In some aspects the PAG is an onium salt, a halogen-containing compound, a diazoketone compound, a sulfone compound, a sulfonate compound, or a combination of any two or more of the onium salt, halogen-containing compound, diazoketone compound, glyoxime derivative, sulfone compound, and sulfonate compound. Other useful photoacid generators include those mentioned in U.S. Pat. No. 7,261,992 B2, at column 10, line 57, to column 11, line 9. These include nitrobenzyl esters and s-triazine derivatives, such as the s-triazine derivatives mentioned in U.S. Pat. No. 4,189,323.

Onium Salts: Examples of onium salts suitable for use as the (C) PAG are iodonium salts, sulfonium salts (including tetrahydrothiophenium salts), phosphonium salts, diazonium salts, and pyridinium salts. Specific examples of onium salts suitable for use as the (C) PAG are listed in U.S. Pat. No. 8,729,148 B2, at column 14, line 40, to column 15, line 4, and tri(4-(4'-acetylphenylthio)-phenyl)sulfonium tetrakis (pentafluorophenyl)borate.

Halogen-containing Compounds: Examples of halogen-containing compounds suitable for use as the (C) PAG are haloalkyl group-containing hydrocarbon compounds, and haloalkyl group-containing heterocyclic compounds. Specific examples of halogen-containing compounds suitable for use as the (C) PAG are (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine, and 1,1-bis(4'-chlorophenyl)-2,2,2-trichloroethane.

Diazoketone Compounds: Examples of diazoketone compounds suitable for use as the (C) PAG are diazomethane derivatives listed in U.S. Pat. No. 8,729,148 B2, at column 15, lines 4 to 23; 1,3-diketo-2-diazo compounds, diazobenzoquinone compounds, and diazonaphthoquinone compounds. As specific examples of diazoketone compounds suitable for use as the PAG are 1,2-naphthoquinonediazido-4-sulfonyl chloride, 1,2-naphthoquinonediazido-5-sulfonyl chloride, 1,2-naphthoquinonediazido-4-sulfonate or 1,2-naphthoquinonediazido-5-sulfonate of 2,3,4,4'-tetrahydroxybenzophenone, and 1, 2-naphthoquinonediazido-4-sulfonate or 1,2-naphthoquinonediazido-5-sulfonate of 1,1,1-tris(4'-hydroxyphenyl)ethane.

Glyoxime Derivatives: Examples of glyoxime derivatives suitable for use as the (C) PAG are listed in U.S. Pat. No. 8,729,148 B2, at column 15, lines 23 to 46.

Sulfone Compounds: Examples of sulfone compounds suitable for use as the (C) PAG are β-ketosulfone, β-sulfonylsulfone, and α-diazo compounds of these compounds. Specific examples of sulfone compounds are 4-trisphenacylsulfone, mesitylphenacylsulfone, and bis(phenylsulfonyl)methane.

Sulfonate Compounds: Examples of sulfonate compounds suitable for use as the (C) PAG are alkyl sulfonate, alkylimide sulfonate, haloalkyl sulfonate, aryl sulfonate, and imino sulfonate. Specific examples of sulfonate compounds suitable for use as the (C) PAG are benzointosylate, pyrogallol tris(trifluoromethanesulfonate), nitrobenzyl-9,10-diethoxyanthracene-2-sulfonate, trifluoromethanesulfonylbicyclo [2.2.1] hept-5-ene-2,3-dicarbodiimide, N-hydroxysuccinimidetrifluoromethanesulfonate, and 1,8-naphthalenedicarboxylic acid imido trifluoromethanesulfonate.

In some embodiments the (C) photoacid generator is diphenyliodoniumtrifluoromethanesulfonate, bis(4-t-butylphenyl)iodonium trifluoromethanesulfonate, bis(4-t-butylphenyl) iodonium nonafluoro-n-butanesulfonate, triphenylsulfonium trifluoromethanesulfonate, triphenylsulfonium nonafluoro-n-butanesulfonate, cyclohexyl-2-oxocyclohexylmethylsulfonium trifluoromethane sulfonate, dicyclohexyl-2-oxocyclohexylsulfonium trifluoromethanesulfonate, 2-oxocyclohexyldimethylsulfoniuni trifluoromethanesulfonate, 4-hydroxy-1-naphthyldimethylsulfonium trifluorornethanesulfonate, 4-hydroxy-1-naphthyltetrahydrothiophenium trifluoromethanesulfonate, 1-(1'-naphthylacetomethyl) tetrahydrothiophenium trifluoromethanesulfonate, trifluoromethanesulfonylbicyclo[2.2.1]hept-5-ene-2,3-dicarbodiimide, N-hydroxysuccinimidetrifluoromethanesulfonate, or 1,8-naphthalenedicarboxylic acid imido trifluoromethanesulfonate.

The amount of the (C) photoacid generator to be used in the silsesquioxane-containing composition (e.g., the photoresist composition) may be from 0.01 to 10 parts by weight, alternatively from 0.05 to 7 parts by weight, alternatively from 0.09 part to 2 parts, all per 100 parts by weight of the (A) silsesquioxane resin. If the amount of the photoacid generator is less than 0.01 part by weight of the (A) silsesquioxane resin, sensitivity and developability (difference in solubility in developer solution such as $TMAH_{aq}$ before and after radiation exposure) of the silsesquioxane-containing composition (e.g., the photoresist composition) containing such a low amount may tend to decrease. If the amount of the PAG exceeds 10 parts by weight of the (A) silsesquioxane resin, the silsesquioxane-containing composition (e.g., the photoresist composition) containing such a large amount may not form a resist pattern having a curved corner top or squared top cross-section profile, possibly due to decreased radiation transmittance.

In some embodiments, the silsesquioxane-containing composition and/or the photoresist composition independently further comprises one or more constituents or additives: (D) a solvent, (E) an adhesion promoter, (F) a dye, (G) a halation inhibitor, (H) a plasticizer, (I) a sensitizer, (J) a stabilizer (e.g., storage stabilizer), and (K) a surfactant. Additives (D) to (K) are optional. In some embodiments the silsesquioxane-containing composition and/or the photoresist composition is free of (lacks) additives (D) to (K). In other embodiments the silsesquioxane-containing composition and/or the photoresist composition independently further comprises at least 1, alternatively at least 2, alternatively 3 or more of additives (D) to (K). In some embodiments the silsesquioxane-containing composition further comprises the (D) solvent, the (E) adhesion promoter, or both (D) and (E).

(D) Solvent: In some embodiments the silsesquioxane-containing composition (e.g., the photoresist composition) is free of (lacks) (D) solvent. In some embodiments the silsesquioxane-containing composition (e.g., the photoresist composition) further comprises one or more (D) solvent. The (D) solvent may be used to dissolve, disperse, or dilute the other constituents of the silsesquioxane-containing composition (e.g., the photoresist composition) to give a mixture that can be more easily coated on a substrate in need of coating. Examples of such substrates for photoresist composition are a semiconductor wafer or metal wafer, or an underlayer (e.g., ARC) of a multilayer photoresist sequentially comprising the substrate, the underlayer, and the coating of the photoresist composition (photoresist layer). The underlayer is disposed (sandwiched") between the photoresist layer and the substrate. Examples of (D) solvent are methyl ethyl ketone (MEK), methyl isobutyl ketone (MIBK), 2-heptanone, methyl pentyl ketone (MAK), cyclopentanone, cyclohexanone, lactate alkyl esters like ethyl lactate, 1,2-propylene glycol monomethyl ether monoacetate (PGMEA), alkylene glycol monoalkyl esters, butyl acetate, 2-ethoxyethanol, and ethyl 3-ethoxypropionate. When present in the silsesquioxane-containing composition (e.g., the photoresist composition), the (D) solvent may be at a concentration of from 50 wt % to 90 wt %, based on total weight of the silsesquioxane-containing composition (e.g., the photoresist composition).

(E) Adhesion promoter: In some embodiments the silsesquioxane-containing composition (e.g., the photoresist composition) is free of (lacks) (F) adhesion promoter. In some embodiments the silsesquioxane-containing composition (e.g., the photoresist composition) further comprises one or more (F) adhesion promoter. The (F) adhesion promoter may be used to enhance bonding of the silsesquioxane-containing composition (e.g., the photoresist composition) to a substrate in need of patterning, such as a semiconductor wafer (e.g., silicon wafer) or a metal surface. The (F) adhesion promoter may also be used to enhance bonding to an underlayer of a multilayer resist, e.g., an underlayer such as an antireflective coating (ARC) or a hardcoat layer. Examples of (F) adhesion promoter are a silane coupling agent such as commercially available silane coupling agents. Silane coupling agents typically contain a functionalized alkyl group, plus three alkoxy groups or two alkoxy groups and an alkyl group, all bonded to the same silicon atom. The functionalized alkyl group may be an aminoalkyl group, an epoxy-alkyl group, an acryloxyalkyl group, a methacryloxyalkyl group, a ureidoalkyl group, an isocyanuratoalkyl group, a mercapto alkyl group, or an alkenyl group. Examples include vinyltrimethoxysilane, 2-(3,4-epoxycyclohexyl)ethyl-trimethoxysilane, and 3-glycidoxypropyl trimethoxysilane. When present in the silsesquioxane-containing composition (e.g., the photoresist composition), the (F) adhesion promoter may be at a concentration of from 0.01 wt % to 5 wt %, based on total weight of the silsesquioxane-containing composition (e.g., the photoresist composition).

(F) Dye: The (F) dye may be used to adjust optical density of the silsesquioxane-containing composition (e.g., the photoresist composition).

(G) Halation inhibitor: The (G) halation inhibitor may be used to prevent spreading of the lithographic radiation (light) beyond borders of the directly exposed areas of a photoresist layer of the photoresist composition.

(H) Plasticizer: The (H) plasticizer may be used to adjust viscosity of the silsesquioxane-containing composition (e.g., the photoresist composition) to enhance its handleability or coatability.

(I) Sensitizer The (I) sensitizer may be used to enhance activity of the (C) photoacid generator by absorbing radiation at a first wavelength, and emitting radiation at a second wavelength transferring the emitted radiation to the (C) photoacid generator, wherein the first and second wavelengths may be the same or different.

(J) Stabilizer: The (J) stabilizer may be used to prolong shelf-life of the silsesquioxane-containing composition (e.g., the photoresist composition), such as by inhibiting oxidative, acid-base, or other degradation reactions therein.

(K) Surfactant: The (K) surfactant may be used to improve uniformity of a coating of the silsesquioxane-containing composition (e.g., the photoresist composition) on a substrate such as a semiconductor wafer or an underlayer (e.g., ARC) of a multilayer photoresist.

The silsesquioxane-containing composition and the photoresist composition may contain other or additional optional additives as constituents. The total concentration of all constituents in the silsesquioxane-containing composition and the photoresist composition is 100%.

In some embodiments the silsesquioxane-containing composition is the photoresist composition. The photoresist composition is a chemically-amplifiable photoresist composition. The photoresist composition may be protected from light having a wavelength shorter than 365 nm until after the photoresist composition has been coated on a substrate and is ready to be masked-irradiated. For example, the photoresist composition may be prepared and coated under an environment consisting essentially of yellow light or red light. After being exposed to light (masked-irradiated), the chemically-amplifiable photoresist composition is converted to a chemically-amplified photoresist composition comprising initially the acid-sensitive photoresist polymer and the product acid. The product acid facilitates cleavage of the acid-sensitive groups of the acid-sensitive photoresist polymer to give a product polymer comprising macromolecular chains that bear pendant acidic groups. The rate of cleavage may be increased by heating the chemically-amplified photoresist composition. After cleavage, the chemically-amplified photoresist composition comprises the product acid and the product polymer. The acid-sensitive photoresist polymer, the PAG, the product acid, and the product polymer are different and distinct compounds.

When a portion of the chemically-amplifiable photoresist composition is exposed to light and another portion of the chemically-amplifiable photoresist composition is not exposed to light, a composite material is formed comprising a non-exposed region comprising the chemically-amplifiable photoresist composition (unreacted) and a light-exposed region comprising the chemically-amplified photoresist composition (cleavage products). When the chemically-amplifiable photoresist composition is restricted in one dimension and the light exposure is done through a photomask defining a pattern, the composite material is formed in the shape of a sheet or film having a non-exposed region and a patterned light-exposed region, which defines a latent pattern of the chemically-amplified photoresist composition. When the chemically-amplifiable photoresist composition is free of a crosslinker that is reactive with the product polymer, a positive resist image may be formed from the latent pattern by developing the sheet or film of the composite material with a developer (e.g., basic solution such as an aqueous base). The developer selectively dissolves the light-exposed region without dissolving the non-exposed region, thereby producing the positive resist image, which is defined by the remaining non-exposed region.

Developer solutions useful for removing the photoresist composition include aqueous solutions comprising water and a base. The base is a chemical compound that is soluble in deionized water to give an aqueous solution having a potential of hydrogen (pH)>7. This basic chemical compound may be an inorganic chemical compound such as ammonia or a Group 1 or 2 metal hydroxide or carbonate. Alternatively, the basic chemical compound may be an organic chemical compound such as an amine or a basic nitrogen-containing heterocycle. Examples of the base are tetramethylammonium hydroxide (TMAH), choline, sodium hydroxide, potassium hydroxide, sodium carbonate, sodium silicate, sodium metasilicate, ammonia, ethylamine, propylamine, diethylamine, dipropylamine, triethylamine, methyldiethylamine, ethyldimethylamine, triethanolamine, pyrrole, piperidine, 1,8-diazabicyclo[5.4.0]-7-undecene, and 1,5-diazabicyclo[4.3.0]-5-nonene. When the photoresist composition is formulated for use as a positive photoresist, the exposed areas of a photoresist layer thereof will be soluble in the developer solution and the unexposed areas will be insoluble in the developer solution. Once the exposed photoresist layer (positive photoresist) has been developed with developer solution, the undissolved remainder of the photoresist layer ("pattern") may be washed with water to remove excess developer solution therefrom.

The developer is different than the (B) oxaamine in structure, formulation, function or use, and/or amount. For example, even when the basic chemical compound of the developer is an amine, it typically is not a (B) oxaamine, but an unsubstituted alkyl-containing amine. Further, the developer is a solution of the basic chemical compound in water, whereas the (B) oxaamine and the silsesquioxane-containing composition containing it is substantially free of water (e.g., has from 0 wt % to less than 1 wt % water). Also, the developer is used in the developing step to selectively dissolve the mask exposed region of the mask exposed film of the photoresist composition, while not dissolving the unexposed region of the film. The (B) oxaamine is primarily used in, and just after, the mask exposing step, where it is believed to chemically amplify the mask exposed region of a film of a photoresist composition comprising the (A) silsesquioxane resin, (B) oxaamine, and (C) photoacid generator or a product acid thereof. The product acid is formed in situ from the (C) photoacid generator upon exposure of the (C) photoacid generator of the mask exposed region of the film of the photoresist composition to radiation in the mask exposing step. The (B) oxaamine may have additional uses in the photoresist composition such as in steps other than the mask exposing step such as in the applying, optional drying, developing, and/or optional heating steps. Additionally, the (B) oxaamine may have uses in embodiments of the silsesquioxane-containing composition that are free of the (C) photoacid generator such as a surfactant, adhesion promoter, solvent, stabilizer, or plasticizer. Further, the basic chemical compound is typically present in the developer at a concentration of from 1 to 5 wt %, whereas the (B) oxaamine is typically present in the silsesquioxane-containing composition at a concentration from 0.01 part to 5 parts, alternatively from 0.05 part to 4 parts, alternatively from 0.07 part to 3 parts, all per 100 parts of the (A) silsesquioxane resin.

The pattern may then be transferred to an underlying substrate. In bilayer photoresists, the transferring comprises transferring the pattern through the underlayer (e.g., ARC or hardcoat layer) onto the substrate (e.g., silicon or metal). In single layer photoresist, there is no underlayer and the pattern is transferred directly onto the substrate. Typically, the pattern is transferred via etching with reactive ions such as oxygen, plasma, or oxygen/sulfur dioxide plasma. Etching methods are well known in the art.

Another embodiment is a process for generating a resist image on a substrate or on an underlayer disposed on a substrate. In some embodiments the process comprises the steps of: (a) coating a substrate with a photoresist composition comprising constituents (A) to (C), and typically also constituent (D) solvent, to form a resist-coated substrate comprising an applied film of the photoresist composition on the substrate; (b) mask exposing (imagewise exposing) the applied film to, or mask irradiating with, radiation (e.g., 248 nm, 193 nm, or 157 nm) to produce a mask-irradiated resist comprising an exposed film containing a latent pattern; and (c) developing the exposed film of the mask-irradiated resist to produce a resist image from the latent pattern to give a developed resist. The developed resist is a manufactured article comprising the resist image disposed on the substrate. In other embodiments the process comprises the steps of: (a) coating an underlayer, which is pre-disposed on a substrate, with a resist composition comprising constituents (A) to (C), and typically also constituent (D) solvent, to form a bilayer on the substrate, wherein the bilayer comprises an applied film of the resist composition disposed on the underlayer; (b) mask exposing (imagewise exposing) the applied film to radiation to produce an exposed film containing a latent pattern; and (c) developing the exposed film to produce a resist image from the latent pattern to give a manufactured article comprising the resist image disposed on the substrate.

Suitable substrates are ceramic, metallic or semiconductive, and preferred substrates are silicon-containing, including, for example, silicon dioxide, silicon nitride, silicon oxynitride, silicon carbide, and silicon oxycarbide.

The underlayer may be a hardcoat layer (e.g., an organic hardcoat layer) or an anti-reflective coating (ARC). The underlayer is formed on the substrate prior to the coating step of forming the film of the resist composition. Typically, the underlayer is composed of is comprised of a material that is highly light absorbing at the imaging wavelength used in the mask exposing step and is chemically compatible with the resist composition. Typical underlayer materials are crosslinked poly(4-hydroxystyrene), polyesters, polyacrylates, polymethacrylates, fluorinated polymers, and cyclic-olefin polymers. E.g., diazonapthoquinone (DNQ) or novolak.

Prior to step (a) coating, typically, the surface of the underlayer or the substrate, as the case may be, is cleaned before the resist composition is applied or coated thereon. Suitable cleaning procedures are known in the art. The resist composition may be coated on the underlayer or directly on the substrate, as the case may be, using techniques such as spin-coating, spray coating, or doctor blading. Typically, the resist film comprises the (D) solvent and is dried (soft baked) before the applied film (after drying) is exposed to radiation in the mask exposing step. The drying or soft baking step may comprise heating the resist film to a temperature in the range of 30° to 200° C., typically from 80° to 140° C., for a short period of time (e.g. 20 to 90 seconds), typically on the order of approximately 1.0 minute. The resulting dried film has a thickness of 0.01 to 5.0 micrometers (µm), alternatively 0.02 to 2.5 µm, alternatively 0.05 to 1.0 µm, and alternatively 0.10 to 0.20 µm.

In step (b) mask exposing, the applied film (e.g., dried applied film) is exposed to radiation through a mask designed to create a latent pattern in the mask exposed film. The latent pattern is suitable for ultimately giving a patterned semiconductor device having a predetermined pattern. The radiation may be UV, X-ray, e-beam, or EUV. The EUV may have a wavelength of 13 nm. Typically, the radiation is UV radiation having a wavelength of 157 nm to 365 nm (e.g., 157 nm or 193 nm). Suitable radiation sources include mercury, mercury/xenon, and xenon lamps. A particular radiation source is a KrF excimer laser or a $F_2$ excimer laser. At longer wavelength radiation is used, e.g., 365 nm, a sensitizer may be included in the photoresist composition to enhance absorption of the radiation. Satisfactory exposure of the photoresist composition is typically achieved by irradiating the applied film with from 10 to <100 millijoules per square centimeter of surface area of the applied film (mJ/cm$^2$), alternatively from 10 to 50 mJ/cm$^2$ of radiation.

In the (b) mask exposing step, the radiation is absorbed by the photoacid generator in the mask exposed regions of the exposed film of the photoresist composition to generate a product acid in situ therein. After the photoresist composition has been exposed to radiation, the resulting exposed film is typically heated to a temperature in the range of 30° C. to 200° C. for a short period of time, on the order of approximately 1 minute. When the photoresist composition is a positive photoresist, the product acid causes cleavage of the acid dissociable groups (e.g., the Z group in formula (I)) of the (A) silsesquioxane resin that is present in the photoresist composition, thereby forming a latent pattern having developer-soluble regions in the exposed film.

In step (c) developing step, the exposed film is contacted with a suitable developer to produce a resist image from the latent pattern of the exposed film. The composition of the developer is described earlier. In the positive photoresist film, the exposed regions of the photoresist will be soluble in developer ("developer-soluble"), and the (c) developing step dissolves the exposed regions in the developer and leaves behind the unexposed regions of the exposed positive photoresist film in the form of a generated image or pattern. After the exposed film has been developed and the generated image or pattern has been formed, typically the remaining resist film ("pattern") is washed with water to remove any residual developer.

The generated image or pattern obtained from step (c) and optional washing step may then be transferred directly into the substrate or through the underlayer into the substrate, as the case may be. Typically, the pattern is transferred by etching with reactive ions such as a molecular oxygen plasma and/or a molecular oxygen/sulfur dioxide plasma. Suitable techniques and machines for forming the plasma include systems such as electron cyclotron resonance (ECR), helicon, inductively coupled plasma, (ICP) and transmission-coupled plasma (TCP).

Thus the photoresist composition may be used in the foregoing photolithographic patterning method or process to manufacture patterned structures. Examples of patterned structures that can be made are metal wiring lines, holes or vias as conduits for electrical contacts, insulation sections (e.g., damascene trenches or shallow trench isolation), trenches for capacitor structures, and other structures that may be used to manufacture integrated circuit devices.

Some embodiments include a resist-coated wafer comprising a layer of the photoresist composition disposed on a semiconductor wafer. The photoresist composition may be directly contacting the semiconductor wafer or the resist-coated wafer may further comprise an underlayer disposed between the layer of the photoresist composition and the semiconductor wafer. The underlayer may be formed by coating the semiconductor wafer with an underlayer composition. The semiconductor wafer may be a bare wafer when it is coated with the photoresist composition or an underlayer composition, as the case may be. Alternatively, the semiconductor wafer may be a primed wafer made by pre-treating a bare semiconductor wafer with a primer. The pre-treating may comprise chemical vapor deposition of a primer. The primer may comprise any compound effective for enhancing adhesion of the photoresist layer or the underlayer, as the case may be, to the semiconductor wafer. For example, the primer compound may be hexamethyldisilazane.

Some embodiments include a soft baked wafer prepared by heating the resist coated wafer for a brief period of time (e.g., 30 to 120 seconds, e.g., 45 to 90 seconds, or 50 to 70 seconds, e.g., 60 seconds) at a temperature of from 80° to 140° C. (e.g., 90° to 120° C., e.g., 100° or 110° C.). The soft baked wafer comprises a soft baked resist layer disposed on the semiconductor wafer or on an underlayer, which is disposed on the semiconductor wafer.

Some embodiments include a masked-irradiated wafer prepared by exposing the resist coated wafer or the soft baked wafer to radiation including, e.g., 248 nm, 193 nm, 157 nm using a dose of from 10 to 75 millijoules per square centimeter (mJ/cm$^2$) surface area of the resist-coated wafer or soft baked wafer. In some embodiments the radiation is dosed at from 15 to 55 mJ/cm$^2$, alternatively from 20 to 50 mJ/cm$^2$, alternatively from 23 to 45 mJ/cm$^2$. The masked-irradiated wafer comprises a masked-irradiated resist layer disposed on the semiconductor wafer or on an underlayer, which is disposed on the semiconductor wafer. The masked-irradiated resist layer contains a latent pattern.

Some embodiments include a post-exposure baked wafer prepared by heating the masked-irradiated wafer for a brief period of time (e.g., 30 to 120 seconds, e.g., 45 to 90 seconds, or 50 to 70 seconds, e.g., 60 seconds) at a temperature of from 80° to 140° C. (e.g., 90° to 120° C., e.g., 100° or 110° C.). The post-exposure baked wafer comprises a post-exposure baked resist layer disposed on the semiconductor wafer or on an underlayer, which is disposed on the semiconductor wafer. The post-exposure baked resist layer contains a latent pattern.

Some embodiments include a developed resist prepared by contacting the masked-irradiated wafer or the post-exposure baked wafer with a developer so as to remove some of the masked-irradiated resist material or some of the post-exposure baked resist material without removing other portions of the material so as to form a resist pattern or image. The developer may comprise an aqueous base solution for positive resist formulations of the photoresist composition. The positive resist formulation comprises constituents (A) to (C). The developed resist comprises a developed resist layer disposed on the semiconductor wafer or on an underlayer, which is disposed on the semiconductor wafer. The developed resist layer contains a resist pattern or resist image. The resist pattern or image may contain vertical features having cross-section profiles characterized by Field Emission Scanning Electron Microscope (FE-SEM) as having curved corner tops or squared corner tops.

Some embodiments include a rinsed resist prepared by rinsing excess developer from the developed resist. Excess developer may cling to the developed resist and may be removed by rinsing the developed resist with a rinsing agent such as a volatile organic solvent. The rinsed resist comprises a rinsed resist layer disposed on the semiconductor wafer or on an underlayer, which is disposed on the semiconductor wafer. The rinsed resist layer contains a resist pattern or resist image. The resist pattern or image may contain vertical features having cross-section profiles characterized by FE-SEM as having curved corner tops or squared corner tops.

Some embodiments include an etched resist prepared by etching the developed resist or rinsed resist with an etching agent using an anisotropic etching technique. The etching agent may comprise a molecular oxygen plasma, a halogen plasma, or a sequential application of a molecular oxygen plasma followed by a halogen plasma. In some embodiments the etched resist is a molecular oxygen plasma etched resist. In other embodiments the etched resist is a halogen plasma etched resist. In other embodiments the etched resist is a sequential molecular oxygen plasma etched followed by halogen plasma etched resist. The molecular oxygen plasma etched resist comprises an etched resist layer disposed on the semiconductor wafer or on a molecular oxygen plasma etched underlayer, which is disposed on the semiconductor wafer. The halogen plasma etched resist layer contains a halogen plasma etched underlayer disposed on a patterned structure comprising a patterned semiconductor wafer.

Some embodiments include a patterned structure prepared by removing the etched resist layer from the patterned semiconductor wafer.

Some embodiments are illustrated in the accompanying drawings.

FIG. 1 is an elevation view of a substrate. In FIG. 1 substrate 1 is an article in need of coating. Examples of the substrate 1 are wafers and sheets. The substrate 1 may be composed of a semiconductor material. The semiconductor material may be based on silicon, germanium, or compounds of gallium. For example, the semiconductor material may be gallium arsenide or gallium nitride. Alternatively, the semiconductor material may be polycrystalline silicon, monocrystalline silicon, or silicon carbide. The substrate 1 may be a homogeneous material or may have two or more layers (not shown). For example, the substrate 1 may have a basal layer and a surface layer on the basal layer. The basal layer may be composed of the semiconductor material and may host the surface layer. The surface layer may be composed of a doped material or a compound of the semiconductor material. Examples of the compound of silicon that may be used as the compound of the semiconductor material are silicon nitride, silicon oxide, silicon carbonitride, silicon oxycarbide, silicon oxynitride, and silicon oxycarbonitride. The surface layer may be formed by doping a surface of a semiconductor material (e.g., vapor deposition of a dopant), by treating a surface of a semiconductor material (e.g., oxidizing), or by depositing a suitable material on a semiconductor material (e.g., vapor deposition).

Figure 2:
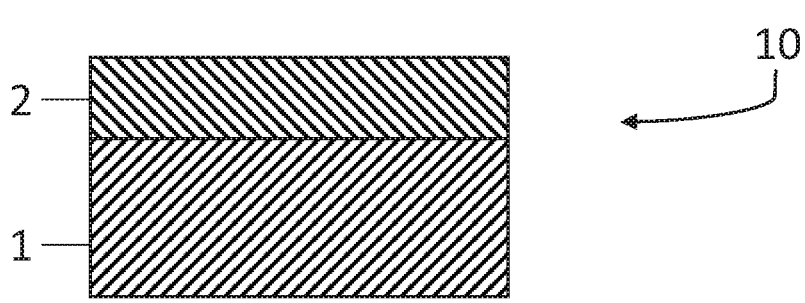
FIG. 2 is an elevation view of an underlayer-on-substrate embodiment.

FIG. 2 is an elevation view of an underlayer-on-substrate. In FIG. 2, underlayer-on-substrate 10 comprises underlayer 2 disposed on substrate 1. Underlayer 2 may be an example of the surface layer of the embodiment of substrate 1 having a basal layer and surface layer. Alternatively, underlayer 2 may be distinct and separate from substrate 1. For example, underlayer 2 may be an anti-reflective coating (ARC) layer or a hardmask layer. Underlayer 2 may be deposited on substrate 1 by any suitable deposition process such as spin-coating.

Figure 3:
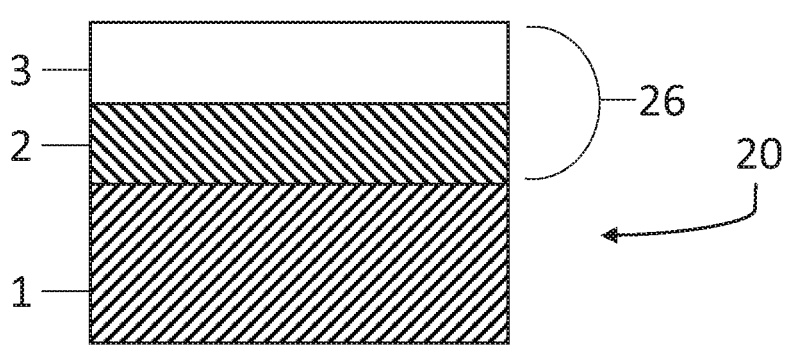
FIG. 3 is an elevation view of a bilayer resist-on-substrate embodiment.

FIG. 3 is an elevation view of a bilayer resist-on-substrate. In FIG. 3, bilayer resist-on-substrate 20 comprises bilayer resist 26 disposed on substrate 1. Bilayer resist 26 is composed of photoresist composition 3 disposed on underlayer 2. Photoresist composition 3 may be deposited on underlayer 2 by any suitable deposition process such as spin-coating. Photoresist composition 3 may be an embodiment of the present photoresist composition, which is a chemically-amplifiable photoresist composition comprising the (A) silsesquioxane resin, (B) oxaamine, and (C) photoacid generator.

Figure 4:
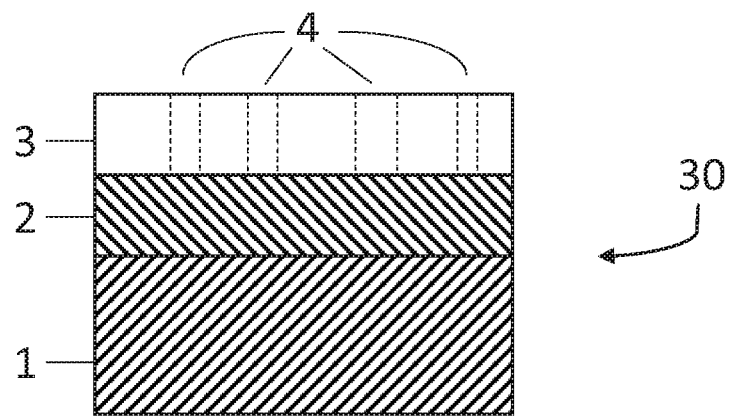
FIG. 4 is an elevation view of a masked-irradiated resist-on-substrate embodiment.

FIG. 4 is an elevation view of a masked-irradiated resist-on-substrate. In FIG. 4, masked-irradiated resist-on-substrate 30 comprises photoresist composition 3 disposed on underlayer 2 disposed on substrate 1, wherein photoresist composition 3 contains latent pattern 4. Photoresist composition 3 may be an embodiment of the present chemically-amplifiable photoresist composition comprising constituents (A), (B), and (C). Initially, latent pattern 4 comprises a chemically-amplified photoresist composition comprising constituents (A) and (B), and a product acid of a light-facilitated reaction of constituent (C). Then the chemically-amplified photoresist composition of latent pattern 4 undergoes a reaction of constituent (A) silsesquioxane resin and the product acid to give a product polymer. The product polymer is formed by a cleavage reaction of the acid dissociable groups of constituent (A). The cleavage reaction is enabled and enhanced (amplified) by the product acid. If desired, the cleavage reaction may be further enhanced by post exposure baking of the masked-irradiated resist-on-substrate 30. After the formation of the product polymer is complete, the masked-irradiated resist-on-substrate 30 is ready for a subsequent step such as developing.

Figure 5:
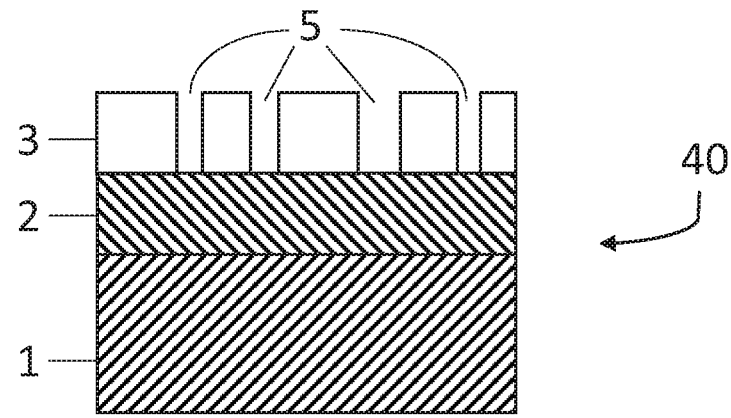
FIG. 5 is an elevation view of a developed resist-on-substrate embodiment.

FIG. 5 is an elevation view of a developed resist-on-substrate. In FIG. 5, developed resist-on-substrate 40 comprises photoresist composition 3 disposed on underlayer 2 disposed on substrate 1. Photoresist composition 3 defines a resist image containing trenches 5. The trenches 5 are volumetric spaces (trenches) from which the latent pattern 4 of the masked-irradiated resist-on-substrate 30 (see FIG. 4) have been removed via a developing step, thereby exposing portions of underlayer 2.

Figure 6:
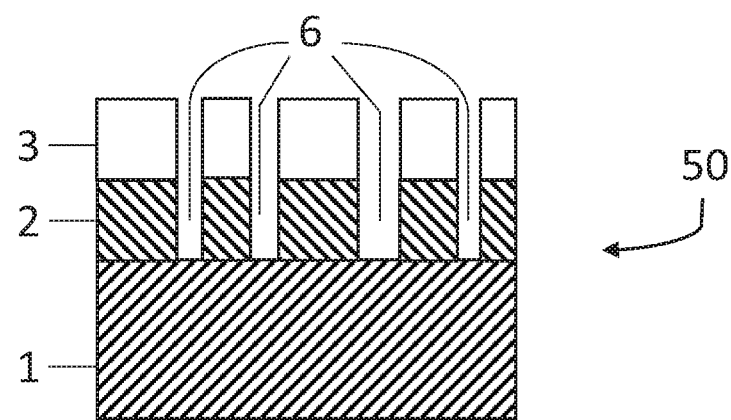
FIG. 6 is an elevation view of a plasma-etched resist-on-substrate embodiment.

FIG. 6 is an elevation view of a plasma-etched resist-on-substrate. In FIG. 6, plasma-etched resist-on-substrate 50 comprises photoresist composition 3 disposed on underlayer 2 disposed on substrate 1. Photoresist composition 3 and underlayer 2 together define a bilayer image containing trenches 6. The trenches 6 are volumetric spaces from which portions of underlayer 2 that were exposed as shown in FIG. 5 have been removed via a plasma etching step, thereby exposing portions of substrate 1. Trenches 6 may have an aspect ratio greater than 5. The plasma etching step may comprise oxygen ($O_2$) plasma.

Figure 7:
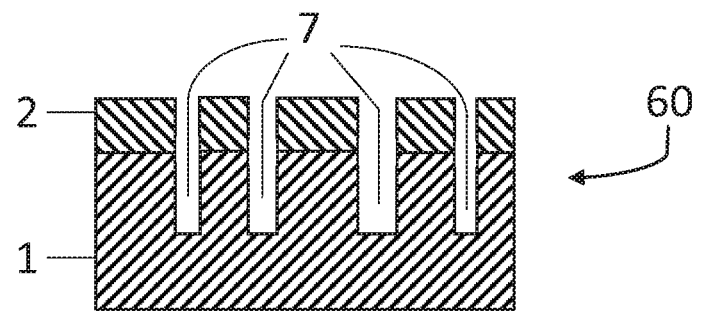
FIG. 7 is an elevation view of a halogen-etched substrate embodiment.

FIG. 7 is an elevation view of a halogen-etched substrate. In FIG. 7, halogen-etched substrate 60 comprises a remainder of underlayer 2 disposed on a remainder of substrate 1. The remainder of underlayer 2 and remainder of substrate 1 together define a transferred pattern comprising trenches 7. The trenches 7 are volumetric spaces from which portions of substrate 1 that were exposed as shown in FIG. 6 have been removed via an etching step such as a halogen etching step, thereby creating trenches 7 in substrate 1. A halogen etching step may comprise a plasma of a chlorofluorocarbon. The chlorofluorocarbon may be trichlorofluoromethane ($CCl_3F$), diclorodifluoromethane ($CCl_2F_2$), dichlorofluoromethane ($HCCl_2F$), chlorodifluoromethane ($HCClF_2$), chlorotrifluoromethane ($CClF_3$), chlorofluoromethane ($H_2CClF$), and combinations of any two or more thereof.

Figure 8:
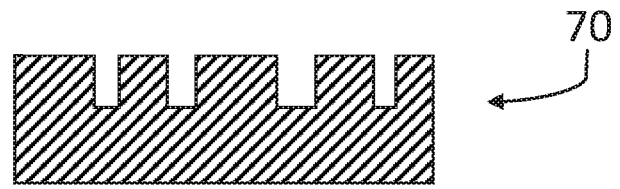
FIG. 8 is an elevation view of a patterned structure embodiment.

FIG. 8 is an elevation view of a patterned structure. In FIG. 8, patterned structure 70 is free of the remainder of underlayer 2 shown in FIG. 7. Patterned structure 70 may comprise metal wiring lines, holes or vias as conduits for electrical contacts, insulation sections (e.g., damascene trenches or shallow trench isolation), trenches for capacitor structures, and other structures that may be used to manufacture integrated circuit devices.

Figure 9:
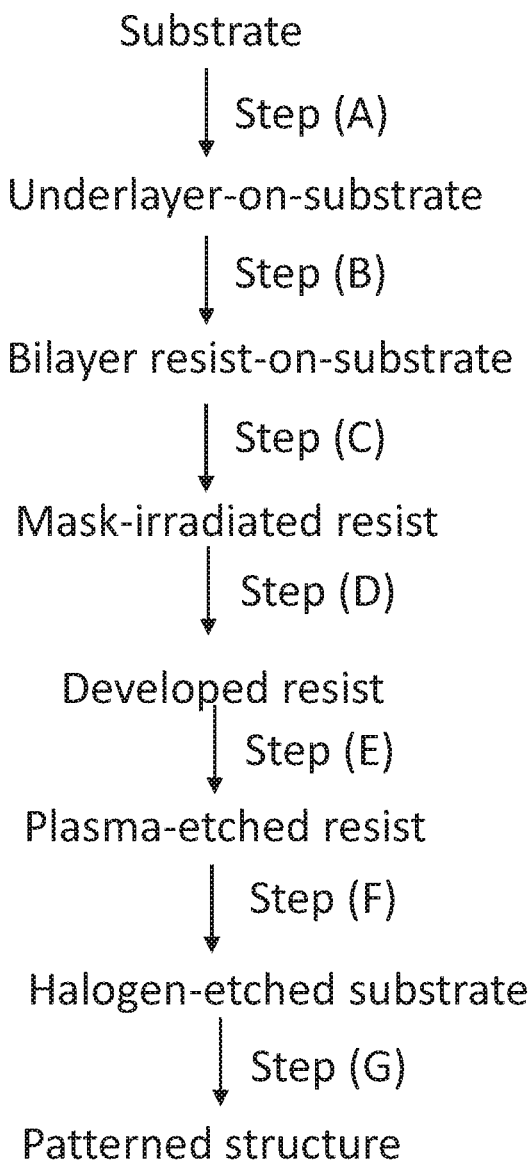
FIG. 9 is a scheme of steps of a process of making a patterned substrate embodiment.

FIG. 9 is a scheme of certain steps of a process of making a patterned structure. In FIG. 9, the process comprises steps (A) to (F) and, optionally, step (G). An embodiment of the process of FIG. 9 is described here with reference to using a positive photoresist composition. In some embodiments the positive photoresist composition comprises constituents (A) to (C), and is free of (lacks) constituent (H) crosslinker. Step (A) comprises coating an underlayer composition on a substrate to give an underlayer-on-substrate (e.g., underlayer-on-substrate 10 of FIG. 2). Step (B) comprises coating a positive photoresist composition on the underlayer-on-substrate to give a bilayer resist-on-substrate (e.g., bilayer resist-on-substrate 20 of FIG. 3). Step (C) comprises selectively irradiating (e.g., through a photomask) a portion of the bilayer resist-on-substrate without irradiating another portion thereof to give a masked-irradiated resist-on-substrate (e.g., masked-irradiated resist-on-substrate 30 of FIG. 4). Step (C) may further comprise soft baking the masked-irradiated resist-on-substrate prior to step (D). Step (D) comprises contacting the masked-irradiated resist-on-substrate with a developer (e.g., an aqueous base) to give a developed resist (e.g., developed resist 40 of FIG. 5). In this embodiment the developed resist would lack the masked-irradiated resist portions of the positive photoresist composition (e.g., the latent pattern 4 portions shown in FIG. 4 would be removed) and would retain the non-irradiated portions of the positive photoresist composition (e.g., would retain the non-irradiated portions of photoresist composition 3 of FIG. 4). Step (D) may further comprise rinsing excess developer from the developed resist, and drying the rinsed developed resist prior to step (E). The rinsing agent may comprise purified water. Step (E) comprises plasma etching the developed resist to give a plasma-etched resist (e.g., plasma-etched resist 50 of FIG. 6). Step (F) comprises halogen etching the plasma-etched resist to give a halogen-etched substrate (e.g., halogen-etched substrate 60 of FIG. 7). Step (G) is optional. Step (G) comprises removing any remainder of bilayer resist material without removing any or removing only insignificant substrate material to give a positively patterned structure (e.g., patterned structure 70 of FIG. 8). Step (G) may comprise halogen etching and may be done by extending the time period for conducting step (F). The etching steps comprise any suitable anisotropic etching technique such as deep reactive ion-etching.

FIG. 10 is a series of black-and-white photographs, obtained using a FE-SEM, of vertical feature cross-section profiles of an inventive resist image embodiment. As shown in FIG. 10, the inventive vertical feature cross-section profiles have curved corner top or squared corner tops and desirably are free of rims of excess material), i.e., are not T-shaped. The focus used for the images from top to bottom of FIG. 10 was 0.2 µm, 0.3 µm, and 0.4 µm, respectively.

FIG. 11 (non-invention) is a series of black-and-white photographs, obtained using a FE-SEM, of vertical feature cross-section profiles of a non-invention resist image. The non-invention resist image is composed of a non-invention resist composition containing an incumbent amine additive (e.g., either 7-diethylamino-4-methylcoumarin or trioctylamine). As shown in FIG. 11, the non-invention vertical feature cross-section profiles have rims of excess material at their tops, i.e., are T-shaped. The focus used for all images in FIG. 11 was 0.2 µm.

The invention is further illustrated by, and an invention embodiment may include any combinations of features and limitations of, the non-limiting examples thereof that follow. Ambient temperature is about 23° C. unless indicated otherwise.

$^{29}$Si-NMR instrument and solvent: a Varian 400 MHz Mercury spectrometer was used. $C_6D_6$ was used as the solvent.

1H-NMR instrument and solvent: a Varian 400 MHz Mercury spectrometer was used. $C_6D_6$ was used as the solvent.

Preparation 1: synthesis of a hydrogen silsesquioxane (HSQ) resin: mixed concentrated sulfuric acid and fuming sulfur trioxide with toluene to give a solution of toluenesulfonic acid monohydrate (TSAM) in toluene. To 100 grams (g) of the solution of TSAM was added dropwise a solution of trichlorosilane (10 g; 0.075 mole) in toluene (50 g) with stirring under nitrogen gas atmosphere. After the addition, the resulting mixture was washed at least three times with deionized (DI) water, and the resulting organic phase was rotary evaporated under reduced pressure to remove some of the solvent, thereby giving a mixture of HSQ resin in toluene and having a solid content of from 5 to 25 wt %.

Oxaamine (B-1): an oxaamine of formula (II) that is tri(2-(hexyloxy)ethyl)-amine from Aldrich Chemical Company.

Oxaamine (B-2): an oxaamine of formula (II) that is tri(2-(methoxyethoxy)ethyl)-amine from Aldrich Chemical Company.

Oxaamine (B-3): an oxaamine of formula (II) that is tri(2-(3'-methylbutyloxy)ethyl)-amine from Aldrich Chemical Company.

Oxaamine (B-4): an oxaamine of formula (II) that is tri(1-methyl-ethanol-2-yl)-amine from Aldrich Chemical Company.

Photoacid generator (C-1): triphenylsulfonium hexafluorophosphate ($Ph_3S^+PF_6^-$; CAS Reg. No. [57840-38-7]) from Midori Kagaku Company, Limited.

Inventive Examples (IEx.) 1a to 1d: synthesis of a constituent (A-1): silsesquioxane resin 1 of formula (I) and solvent exchanged products thereof. To a 50:50 w/w solution of bicyclo[2.2.1]hept-5-ene-2-carboxylic acid 1,1-dimethylethyl ester (0.1 mole) in anhydrous toluene was added platinum(0) 1,3-diethyenyl-1,1,3,3-tetramethyldisiloxane complex. To the resulting mixture was slowly added under a nitrogen gas atmosphere the mixture of hydrogen silsesquioxane resin of Preparation 1 (containing about 0.33 mole of HSQ resin). After addition was complete, the resulting mixture was refluxed for 8 hours while stirring. Progress of the resulting hydrosilylation reaction was monitored by 1H-NMR for complete disappearance of peaks for the olefinic hydrogen atoms of bicyclo[2.2.1]hept-5-ene-2-carboxylic acid 1,1-dimethylethyl ester to give a mixture of silsesquioxane resin 1 in toluene (IEx. 1a). Once the peaks disappeared, the toluene of the reaction mixture was solvent exchanged with 1,2-propylene glycol monomethyl ether monoacetate (PGMEA), ethyl lactate (EL), or methyl isobutyl ketone (MIBK) to give a mixture of silsesquioxane resin 1 in PGMEA (IEx. 1b), a mixture of silsesquioxane resin 1 in EL (IEx. 1c), or a mixture of silsesquioxane resin 1 in MIBK (IEx. 1d), respectively. The mixtures of IEx. 1a to 1d contained from 4 to 45 wt % of the silsesquioxane resin 1 in the ad rem solvent. E.g., the mixture of IEx. 1 b contained 20 wt % silsesquioxane resin 1 in PGMEA.

IEx. 2a to 2d: (Prophetic) synthesis of silsesquioxane resin-containing compositions. In separate experiments, mix separate aliquots of the 20 wt % silsesquioxane resin 1 in PGMEA of IEx. 1b with a different one of oxaamine (B-1), (B-2), (B-3), or (B-4) to give a different silsesquioxane resin-containing composition of IEx. 2a, 2b, 2c, or 2d, respectively. Use 0.10 part oxaamine per 100 parts of silsesquioxane resin 1. If desired, the silsesquioxane resin-containing compositions of IEx. 2a to 2d are separately filtered through a 0.10 μm polytetrafluoroethylene filter to give filtrates of IEx. 2a to 2d. Alternatively, the silsesquioxane resin-containing compositions of IEx. 2a to 2d are unfiltered, but used directly to prepare corresponding photoresist compositions.

IEx. 3a to 3d: preparation of photoresist compositions. In four separate experiments, under yellow light was mixed photoacid generator (C-1) with aliquots of 20 wt % silsesquioxane resin 1 in PGMEA (IEx. 1b) to give four mixtures. Used 1.00 part of photoacid generator (C-1) per 100 parts of silsesquioxane resin 1. Each of the four mixtures was diluted with PGMEA to give diluted mixtures containing 16 wt % of silsesquioxane resin 1 and the photoacid generator (C-1) in PGMEA. To different ones of the diluted mixtures was added a different one of oxaamine (B-1), (B-2), (B-3), or (B-4) to give a different photoresist composition of 3a, 3b, 3c, or 3d, respectively. Used 0.10 part oxaamine per 100 parts of silsesquioxane resin 1.

IEx. 4a to 4d: preparation of resist-coated wafers. In separate experiments the photoresist composition of IEx. 3a, 3b, 3c, or 3d was filtered through a 0.10 μm polytetrafluoroethylene filter to give a corresponding filtrate, and the filtrate was spin-coated onto a different one of bare silicon wafers to give a resist-coated wafer of IEx. 4a, 4b, 4c, or 4d, respectively. ("Bare" means the silicon wafer did not contain an underlayer and was not pretreated with a primer.) Each resist-coated wafer comprised a resist layer disposed directly on the wafer. Each resist layer had a thickness of 5,000 angstroms (Å). The procedure of IEx. 4a was repeated four more times to give a total of five resist-coated wafers of IEx. 4a.

IEx. 5a-1 to 5a-5: preparation of soft baked resists. In separate experiments the resist-coated wafers of IEx. 4a were heated for 60 seconds at a temperature of 90° C. (IEx. 5a-1), 100° C. (IEx. 5a-2 to IEx. 5a-4), or 120° C. (IEx. 5a-5), and then cooled to give the soft baked resists of IEx. 5a-1 to 5a-5, respectively.

IEx. 5b to 5d: preparation of soft baked resists. In separate experiments the resist-coated wafer of IEx. 4b, 4c, or 4d was heated for 60 seconds at a temperature of 100° C., and then cooled to give the soft baked resists of IEx. 5b to 5d, respectively.

IEx. 6a-1 to 6a-5: preparation of masked-irradiated resists. In separate experiments the soft baked resists of IEx. 5a-1 to IEx. 5a-5 were placed in a mask aligner and exposed to radiation at 248 nm using conventional illumination through a binary photomask and a KrF scanner, ASML PAS 5500/850D, using an optimized exposure dose (Eop) of 30 millijoules per square centimeter of surface area ($mJ/cm^2$) (IEx. 6a-1), 28 $mJ/cm^2$ (IEx. 6a-2), 25 $mJ/cm^2$ (IEx. 6a-3), 19 $mJ/cm^2$ (IEx. 6a-4), or 20 $mJ/cm^2$ (IEx. 6a-5) to give the masked-irradiated resists of IEx. 6a-1 to 6a-5, respectively.

IEx. 6b to 6d: preparation of masked-irradiated resists. In separate experiments the soft baked resist of IEx. 5b, 5c, or 5d was exposed to radiation at 248 nm using conventional illumination through a binary photomask and ASML PAS 5500/850D using an Eop of 35 $mJ/cm^2$ (IEx. 6b), 24 $mJ/cm^2$ (IEx. 6c), or 50 $mJ/cm^2$ (IEx. 6d) to give the masked-irradiated resists of IEx. 6b to 6d, respectively.

IEx. 7a-1 to 7a-5: preparation of post-exposure baked resists. In separate experiments the masked-irradiated resists of IEx. 6a-1 to IEx. 6a-5 were heated for 60 seconds at a temperature of 100° C. (IEx. 7a-1 and IEx. 7a-2), 110° C. (IEx. 7a-3), or 120° C. (IEx. 7a-4 and IEx. 7a-5), then cooled to give post exposure baked resists of IEx. 7a-1 to 7a-5, respectively.

IEx. 7b to 7d: preparation of post-exposure baked resists. In separate experiments the masked-irradiated resist of IEx. 6b, 6c, or 6d was heated for 60 seconds at 100° C., then cooled to give the post-exposure baked resists of IEx. 7b to 7d, respectively.

IEx. 8a-1 to 8a-5: preparation of developed resists. In separate experiments conducted using a single puddle process without pre-wetting, the post-exposure baked resists of IEx. 7a-1 to IEx. 7a-5 were developed in 2.38 wt % aqueous TMAH solution for 60 seconds at a temperature of 25° C. to give the developed resists of IEx. 8a-1 to 8a-5, respectively. The developed resists contained resist patterns or images including 5 μm result.

IEx. 8b to 8d: preparation of developed resists. In separate experiments conducted using a single puddle process without pre-wetting, the post-exposure baked resist of IEx. 7b, 7c, or 7d was developed in 2.38 wt % aqueous TMAH solution for 60 seconds at a temperature of 25° C. to give the developed resists of IEx. 8b to 8d, respectively. The developed resists of IEx. 8b to 8d contained resist patterns or images including 5 μm result.

IEx. 9a-1 to 9a-5 and 9b to 9d: characterizations of the developed resists. Each of the developed resists of IEx. 8a-1 to 8a-5 and 8b to 8d were imaged with an FE-SEM (Hitachi model number 4700) to obtain cross-section profiles; and examined with a Critical Dimension Scanning Electron Microscope (CD-SEM; Hitachi model number 9380) to assess mask irradiating dose responsiveness as a change of critical dimension (CD) per unit change in optimal energy (Eop). The data are reported below in Table 1.

TABLE 1

FE-SEM and CD-SEM analysis of developed resists of IEx. 8a-1 to 8a-5 and 8b to 8d.

| Developed Resist | Oxaamine | Pattern Cross-section Profile | Exposure latitude |
|---|---|---|---|
| IEx. 8a-1 | (B-1) | Curved corner top | 7.3 |
| IEx. 8a-2 | (B-1) | Squared corner top | 8.2 |
| IEx. 8a-3 | (B-1) | Squared corner top | 10.3 |
| IEx. 8a-4 | (B-1) | Squared corner top | 13.1 |
| IEx. 8a-5 | (B-1) | Squared corner top | 14.0 |
| IEx. 8b | (B-2) | Squared corner top | 9.7 |
| IEx. 8c | (B-3) | Squared corner top | 7.1 |
| IEx. 8d | (B-4) | Squared corner top | 12.4 |

As shown by the data in Table 1, the inventive developed resists of IEx. 8a-1 to 8a-5 and 8b to 8d beneficially showed desirable cross-section profiles and slow changes in CD per unit change in Eop (referred to as low exposure latitudes). Particularly, the inventive developed resists beneficially showed cross-section profiles having curved corners top or squared corners top. The inventive developed resists also showed exposure latitudes of less than 15.

In some embodiments the inventive developed resist is characterized by a resist image or pattern having a cross-section profile that has a curved corner top or a squared corner top; alternatively a curved corner top; alternatively a squared corner top. The cross-section profile is determined using FE-SEM as described in any one of IEx. 9a-1 to 9a-5 and 9b to 9d.

In some embodiments the inventive developed resist is characterized by an exposure latitude of from 7 to 15.0, alternatively from 7.0 to 14.4, alternatively from 7.1 to 14.0, alternatively 14.0±1, alternatively 13±1, alternatively 12±1, alternatively 10±1, alternatively 8±1. In some embodiments the inventive developed resist is characterized by any one of the foregoing exposure latitudes and by a resist image or pattern having a cross-section profile that has a squared corner top. In some embodiments the inventive developed resist is characterized by any one of the foregoing exposure latitudes and by a resist image or pattern having a cross-section profile that has a curved corner top.

If desired, the developed resists of IEx. 8a-1 to 8a-5 and 8b to 8d may be rinsed with a rinse agent to remove excess developer and give corresponding rinsed resists. The rinsed resists may be etched using an etching agent such as molecular oxygen plasma and/or halogen-containing plasma and an anisotropic etching technique to give corresponding etched resists. The etched resists may be further etched using an etching agent such as halogen-containing plasma and an anisotropic etching technique to give corresponding patterned structures. The patterned structures comprise a patterned silicon wafer and are free of the photoresist composition or the aforementioned products prepared therefrom.

Comparative Example 1 (non-invention): a developed resist was made according to the procedures used to prepare IEx. 8d except 7-diethylamino-4-methylcoumarin was used in place of the oxaamine (B-4) and Eop of 47 mJ/cm$^2$ was used instead of 50 mJ/cm$^2$ to give a non-invention developed resist of Comparative Example 1. When analyzed using the foregoing FE-SEM and CD-SEM methods, the developed resist was found to have an exposure latitude of 19.4.

Comparative Example 2 (non-invention): a developed resist was made according to the procedures used for IEx. 8b except trioctylamine was used in place of the oxaamine (B-2) to give a non-invention developed resist of Comparative Example 2. When analyzed using the foregoing FE-SEM and CD-SEM methods, the developed resist was found to have an exposure latitude of 15.2.

The below claims are incorporated by reference here, and the terms "claim" and "claims" are replaced by the term "aspect" or "aspects," respectively. Embodiments of the invention also include these resulting numbered aspects.

What is claimed is:

1. A silsesquioxane-containing composition comprising (A) a silsesquioxane resin and (B) an oxaamine, wherein:
the (A) silsesquioxane resin is of formula (I):
$[HSiO_{3/2}]_{t1}[Z-L-SiO_{3/2}]_{t2}[H(R^1O)SiO_{2/2}]_d[(R^1O)_x SiO_{(4-x)/2}]_y[R^2SiO_{3/2}]_{t3}$ (I), wherein:
subscript t1 is a mole fraction of from 0.4 to 0.9;
subscript t2 is a mole fraction of from 0.1 to 0.6;
subscript d is a mole fraction from 0 to 0.45;
subscript x is an integer of 1, 2, or 3;
subscript y is a mole fraction from 0 to 0.25;
subscript t3 is a mole fraction from 0 to 0.15;
the sum of t1+t2=from >0.9 to <1 and the sum of t1+t2+d+y+t3=1;
each $R^1$ is independently H or (C$_1$-C$_5$)alkyl;
each $R^2$ is independently HO-L- or HOOC-L-;
each L is independently a divalent (C$_1$-C$_{20}$)hydrocarbon group that is unsubstituted or substituted with at least 1 substituent independently selected from (C$_1$-C$_3$)alkyl, —OH, and a fluorine atom up to and including perfluoro-substitution; and
each Z is —OH, —COOH, —O-THP, —OCH(R$^{3a}$)$_2$, —OC(R$^{3b}$)$_3$, —COOCH(R$^{3a}$)$_2$, —COOC(R$^{3b}$)$_3$, —OCOOCH(R$^{3a}$)$_2$, or —OCOOC(R$^{3b}$)$_3$,
wherein THP is tetrahydropyran-2-yl;
wherein each $R^{3a}$ is independently a (C$_1$-C$_6$)alkyl, (C$_3$-C$_{12}$)cycloalkyl, (C$_6$-C$_{10}$)aralkyl, ((C$_1$-C$_6$)alkyl)3SiCH2CH2-, or 2 $R^{3a}$ together with the carbon atom to which they are both bonded are a (C$_3$-C$_{12}$)cycloalkyl or a (C$_6$-C$_{12}$)bicyclonlkyl; and
wherein each $R^{3b}$ independently a (C$_1$-C$_6$)alkyl, (C$_3$-C$_{12}$)cycloalkyl, (C$_6$-C$_{10}$)aralkyl, ((C$_1$-C$_6$)alkyl)3SiCH2CH2-; or 2 together with the carbon atom to which they are both bonded are a (C$_3$-C$_{12}$)cycloalkyl or a (C$_6$-C$_{12}$)bicycloalkyl and the remaining $R^{3b}$ is independently a (C$_1$-C$_5$)alkyl, (C$_3$-C$_{12}$)cycloalkyl, (C$_6$-C$_{10}$)aralkyl, or ((C$_1$-C$_6$)alkyl)3SiCH2CH2-; or all 3 $R^{3b}$ together with the carbon atom to which they are all bonded are a (C$_7$-C$_{12}$)bicycloalkyl; and
the (B) oxaamine is of formula (II): N—[CH$_2$CH(R$^4$)O—R$^5$]$_3$ (II), wherein:
each $R^4$ is independently H or an unsubstituted (C$_1$-C$_{12}$)alkyl; and
each $R^5$ is independently H or a (C$_1$-C$_{12}$)alkyl, which is unsubstituted or independently substituted with 1, 2, or 3 (C$_1$-C$_{12}$)alkoxy groups.

2. The silsesquioxane-containing composition of claim 1 wherein in the (A) silsesquioxane resin:
subscript t1 is a mole fraction of from 0.4 to 0.65; or
subscript t1 is a mole fraction of from 0.65 to 0.9; or
subscript t2 is a mole fraction of from 0.1 to 0.35; or
subscript t2 is a mole fraction of from 0.5 to 0.6; or
subscript d is 0; or
subscript d is a mole fraction from >0 to 0.45; or subscript x is 1; or
subscript x is 2; or
subscript x is 3; or
subscript y is 0; or
subscript y is a mole fraction from >0 to 0.25; or
subscript t3 is 0; or
subscript t3 is a mole fraction from >0 to 0.15; or
at least one $R^1$ is H; or
subscript d is a mole fraction from >0 to 0.45 or subscript y is a mole fraction from >0 to 0.25 and at least one $R^1$ is H; or
at least one $R^1$ is independently $(C_1-C_6)$alkyl; or
subscript d is a mole fraction from >0 to 0.45 or subscript y is a mole fraction from >0 to 0.25 and at least one $R^1$ is $(C_1-C_6)$alkyl; or
at least one is independently HO-L-; or
subscript t3 is a mole fraction from >0 to 0.15 and at least one is independently HO-L-; or
at least one is independently HOOC-L-; or
subscript t3 is a mole fraction from >0 to 0.15 and at least one $R^2$ is independently HOOC-L-; or
at least one L is independently a divalent $(C_1-C_{20})$hydrocarbon group that is unsubstituted; or
at least one L is independently a divalent $(C_6-C_{10})$bicycloalkane group that is unsubstituted; or
at least one L is a divalent $(C_1-C_{20})$hydrocarbon group that is substituted with at least 1 $(C_1-C_3)$alkyl group; or
at least one L is a divalent $(C_6-C_{10})$bicycloalkane group that is substituted with at least 1 t $C_1-C_3$)alkyl group; or
at least one L is a divalent $(C_1-C_{20})$hydrocarbon group that is substituted with at least 1 —OH group; or
at least one L is a divalent $(C_6-C_{10})$bicycloalkane group that is substituted with at least 1 —OH group; or
at least one L is independently a divalent $(C_1-C_{20})$hydrocarbon group that is substituted with at least 1 fluorine atom up to and including perfluoro-substitution; or
at least one L is independently a divalent $(C_6-C_{10})$bicycloalkane group that is substituted with at least 1 fluorine atom up to and including perfluoro-substitution; or
at least one Z is —OH; or
at least one Z is —COOH; or
at least one Z is —O-THP; or
at least one Z is —OCH$(R^{3a})_2$; or
at least one Z is —COOCH$(R^{3a})_2$; or
at least one Z is —OCOOCH$(R^{3a})_2$; or
at least one Z is —OR$(R^{3b})$; or
at least one Z is —COOC$(R^{3b})_3$; or
at least one Z is —OCOOC$(R^{3b})_3$; or
at least one $R^{3a}$ or $R^{3b}$ is independently a $(C_1-C_6)$alkyl; or
at least one $R^{3a}$ or $R^{3b}$ is independently $(C_3-C_{12})$cycloalkyl; or
at least one $R^{3a}$ or $R^{3b}$ is independently $(C_6-C_{10})$aralkyl; or
at least one $R^{3a}$ or $R^{3b}$ is independently $((C_1-C_6)$alkyl) 3SiCH2CH2-; or
2 $R^{3a}$ or 2 $R^{3b}$ together with the carbon atom to which they are both bonded are a $(C_3-C_{12})$cycloalkyl or a $(C_5-C_{12})$ bicycloalkyl; or
all 3 $R^{3b}$ together with the carbon atom to which they are all bonded are a $(C_7-C_{12})$bicycloalkyl.

3. The silsesquioxane-containing composition of claim 1 wherein in the (A) silsesquioxane resin of formula (I) the Z-L- is selected from the following monovalent carboxylic esters: a bicyclo[2.2.1]heptane-5-yl-2-carboxylic acid, secondary aliphatic ester; a bicyclo[2.2.1]heptane-5-yl-2-carboxylic acid, tertiary aliphatic ester; a bicyclo[2.2.1]heptane-6-yl-2-carboxylic acid, secondary aliphatic ester; or a bicyclo[2.2.1]heptane-6-yl-2-carboxylic acid, tertiary aliphatic ester.

4. The silsesquioxane-containing composition of claim 3 wherein Z-L- is selected from the following monovalent carboxylic esters:
bicyclo[2.2.1]heptane-5-yl-2-carboxylic acid, 1',1'-dimethylethyl ester;
bicyclo[2.2.1]heptane-6-yl-2-carboxylic acid, 1',1'-dimethylethyl ester;
bicyclo[2.2.1]heptane-5-yl-2-carboxylic acid, 1'-methylethyl ester;
bicyclo[2.2.1]heptane-6-yl-2-carboxylic acid, 1'-methylethyl ester;
bicyclo[2.2.1]heptane-5-yl-2-carboxylic acid, adaman-1'-yl ester;
bicyclo[2.2.1]heptane-6-yl-2-carboxylic acid, adaman-1'-yl ester;
bicyclo[2.2.1]heptane-5-yl-2-carboxylic acid, 3'-methyladaman-1'-yl ester;
bicyclo[2.2.1]heptane-6-yl-2-carboxylic acid, 3'-methyladaman-1'-yl ester;
bicyclo[2.2.1]heptane-5-yl-2-carboxylic acid, 2'-methyladaman-2'-yl ester;
bicyclo[2.2.1]heptane-6-yl-2-carboxylic acid, 2'-methyladaman-2'-yl ester;
bicyclo[2.2.1]heptane-5-yl-2-carboxylic acid, 2'-ethyladaman-2'-yl ester;
bicyclo[2.2.1]heptane-6-yl-2-carboxylic acid, 2'-ethyladaman-2'-yl ester;
bicyclo[2.2.1]heptane-5-yl-2-carboxylic acid, cyclohexyl ester;
bicyclo[2.2.1]heptane-6-yl-2-carboxylic acid, cyclohexyl ester;
bicyclo[2.2.1]heptane-5-yl-2-carboxylic acid, 1'-ethylcyclopentyl ester;
bicyclo[2.2.1]heptane-6-yl-2-carboxylic acid, 1'-ethylcyclopentyl ester;
bicyclo[2.2.1]heptane-5-yl-2-carboxylic acid, 2'-hydroxy-2',6',6'-trimethylbicyclo[3.1.1]heptane-3'-yl ester; and
bicyclo[2.2.1]heptane-6-yl-2-carboxylic acid, 2'-hydroxy-2',6',6'-trimethylbicyclo[3.1.1]heptane-3'-yl ester.

5. The silsesquioxane-containing composition of claim 1 wherein the (A) silsesquioxane resin of formula (I) has a weight average molecular weight ($M_w$) of 1,000 to 50,000.

6. The silsesquioxane-containing composition of any claim 1 wherein in the (B) oxaamine of formula (II):
subscript m is an integer from 1 to 5.5;
subscript m is an integer from 5.5 to 10;
subscript n is 1;
subscript n is 2;
subscript n is 3;
n is 1 or 2 and $R^N$ is unsubstituted $(C_1-C_{12})$alkyl;
at least one is independently H;
at least one is independently an unsubstituted $(C_1-C_{12})$alkyl;
at least one $R^4$ is independently H;
at least one $R^4$ is independently a $(C_1-C_{12})$alkyl, which is unsubstituted;
at least one $R^4$ and $R^5$ is independently an unsubstituted $(C_1-C_5)$alkyl;
at least one $R^4$ and $R^5$ is independently an unsubstituted $(C_6-C_{12})$alkyl;

at least one $R^5$ is independently a $(C_1-C_{12})$alkyl, which is independently substituted with 1, 2, or 3 $(C_1-C_{12})$ alkoxy groups;
at least one $R^5$ is independently a $(C_1-C_{12})$alkyl, which is independently substituted with 1 $(C_1-C_{12})$alkoxy group;
at least one $R^5$ is independently a $(C_1-C_5)$alkyl, which is independently substituted with 1 $(C_1-C_5)$alkoxy group;
at least one $R^5$ is independently a $(C_1-C_{12})$alkyl, which is independently substituted with 2 $(C_1-C_{12})$alkoxy groups;
at least one $R^5$ is independently a $(C_1-C_{12})$alkyl, which is independently substituted with 3 $(C_1-C_{12})$alkoxy groups;
at least one $R^5$ is independently a $(C_1-C_{12})$alkyl, which is independently substituted with 1, 2, or 3 $(C_1-C_{12})$ alkoxy groups; or
at least one $R^5$ is independently a $(C_1-C_{12})$alkyl, which is independently substituted with 1, 2, or 3 $(C_6-C_{12})$ alkoxy groups.

7. The silsesquioxane-containing composition of claim 1 wherein the (B) oxaamine of formula (II) is selected from:
tri(1-methyl-ethanol-2-yl)-amine;
tri(2-(3'-methylbutyloxy)ethyl)- amine;
tri(2-(hexyloxy)ethyl)- amine;
tri(2-(methoxymethoxy)ethyl)-amine.

8. A silsesquioxane-containing composition comprising the silsesquioxane-containing composition of claim 1 and (C) a photoacid generator, wherein the (C) photoacid generator comprises an onium salt, a halogen-containing compound, a diazoketone compound, a glyoxime derivative, a sulfone compound, a sulfonate compound, or a combination of any two or more thereof.

9. The silsesquioxane-containing composition of claim 1 independently further comprising one or more constituents: (D) a solvent or (E) an adhesion promoter.

10. A manufactured article comprising the silsesquioxane-containing composition of claim 1.

11. A method of making a resist image on a substrate, the method comprising:
applying the silsesquioxane-containing composition of claim 1 to a surface of a substrate so as to form an applied film thereof on the surface of the substrate, wherein the silsesquioxane-containing composition comprises the (A) silsesquioxane resin, the (B) oxaamine, and (C) a photoacid generator;
mask exposing the applied film to radiation to produce an exposed film containing a latent pattern;
developing the exposed film to produce a resist image from the latent pattern to give a manufactured article comprising the resist image disposed on the substrate.

12. The method of making a resist image on a substrate of claim 11, wherein:
the substrate comprises a bare semiconductor wafer;
the substrate comprises a primed semiconductor wafer;
the substrate comprises a primed semiconductor wafer prepared by priming a bare semiconductor wafer with hexamethyldisilazane;
the substrate comprises a semiconductor wafer and the silsesquioxane-containing composition is applied directly on a surface of the semiconductor wafer;
the substrate comprises a semiconductor wafer having a surface portion comprising silicon carbide, silicon carbonitride, silicon nitride, silicon oxide, silicon oxynitride, or silicon oxycarbonitride, and the silsesquioxane-containing composition is applied directly on the surface portion of the semiconductor wafer;
the substrate comprises an underlayer disposed on a surface of a semiconductor wafer and the silsesquioxane-containing composition is applied directly on the underlayer without being applied directly on the semiconductor wafer;
before the applying step the silsesquioxane-containing composition further comprises (D) a solvent and the applying step comprises spin-coating;
the applied film further comprises (D) a solvent and the method further comprises drying the applied film (soft baking) before the mask exposing step;
the applied film has a thickness of from 0.01 to 5 micrometers;
the radiation is selected from ultraviolet (UV) light, X-ray radiation, e-beam radiation, and extreme ultraviolet (EUV) radiation;
the radiation has a wavelength in a range of from 13 nanometers (nm) to 365 nm;
the radiation has a wavelength comprising 365 nm, 248 nm, 193 nm, 157 nm, or 13 nm;
the developing step comprises contacting the mask exposed film with a developer comprising an aqueous base;
the method further comprises heating the mask exposed film at a temperature from 30 degrees Celsius (° C.) to 200° C. and cooling the mask exposed film before the developing step and the developing step comprises contacting the cooled mask exposed film with a developer comprising an aqueous base; or
the developing step comprises contacting the mask exposed film with a developer comprising aqueous tetramethylammonium hydroxide.

13. The method of making a resist image on a substrate of claim 11, wherein:
the substrate comprises a hardmask layer disposed on a surface of a semiconductor wafer and the silsesquioxane-containing composition is applied directly on the hardmask layer without being applied directly on the semiconductor wafer and the method further comprises oxygen ($O_2$) plasma etching the resist image to etch the hardmask layer by transferring the resist image into the hardmask layer and give a first semiconductor device comprising a bilayer image disposed on the surface of the semiconductor wafer, wherein the bilayer image comprises a resist image layer and a hardmask image layer, and wherein a region of the surface of the semiconductor wafer is covered by the bilayer image and another region of the surface of the semiconductor wafer is uncovered; or
the substrate comprises a hardmask layer disposed on a surface of a semiconductor wafer and the silsesquioxane-containing composition is applied directly on the hardmask layer without being applied directly on the semiconductor wafer and the method further comprises: (i) oxygen ($O_2$) plasma etching the resist image to etch the hardmask layer by transferring the resist image into the hardmask layer to give a first semiconductor device sequentially comprising a bilayer image disposed on the surface of the semiconductor wafer, wherein the bilayer image comprises a resist image layer and a hardmask image layer, and wherein a region of the surface of the semiconductor wafer is covered by the bilayer image and another region of the surface of the semiconductor wafer is uncovered; and (ii) halogen-containing etching the uncovered region of the surface of the semiconductor wafer of the first semiconductor device to transfer the bilayer image into the semiconductor wafer by removing the remaining applied film, at least some of the hardmask layer, and some, but not all, of the uncovered region of the semiconductor wafer to give a second semiconductor device comprising a semiconductor image disposed on a basal semiconductor layer.

14. A semiconductor device comprising the first or second semiconductor device made by the method of claim 13.

\* \* \* \* \*

UNITED STATES PATENT AND TRADEMARK OFFICE
CERTIFICATE OF CORRECTION

PATENT NO. : 10,990,012 B2
APPLICATION NO. : 16/092463
DATED : April 27, 2021
INVENTOR(S) : Fu et al.

It is certified that error appears in the above-identified patent and that said Letters Patent is hereby corrected as shown below:

In the Claims

Column 28, Claim 1, Line 28 should read: each $R^1$ is independently H or $(C_1-C_6)$alkyl;

Column 28, Claim 1, Line 46 should read: 3SiCH2CH2-; or 2 R3b together with the carbon atom to Column 28, Claim 1, Line 49 should read: independently a $(C_1-C_6)$alkyl, $(C_3-C_{12})$cycloalkyl, Column 29, Claim 2, Line 16 should read: at least one $R^2$ independently HO-L-; or Column 29, Claim 2, Line 18 should read: one $R^2$ is independently HO-L-; or Column 29, Claim 2, Line 19 should read: at least one $R^2$ is independently HOOC-L-; or Column 29, Claim 2, Line 29 should read: that is substituted with at least 1 $(C_1-C_3)$alkyl group; or Column 29, Claim 2, Line 47 should read: at least one Z is -OC$(R^{3b})$3; or Column 29, Claim 2, Line 58 should read: both bonded are a $(C_3-C_{12})$cycloalkyl or a $(C_6-C_{12})$ Column 30, Claim 6, Line 57 should read: n is 1 or 2 and $R^N$ is unsubstituted $(C_1-C_4)$alkyl;

Column 30, Claim 6, Line 58 should read: at least one $R^4$ is independently H;

Column 30, Claim 6, Line 59 should read: at least one $R^4$ is independently an unsubstituted $(C_1-C_{12})$ Column 30, Claim 6, Line 61 should read: at least one $R^5$ is independently H;

Column 30, Claim 6, Line 62 should read: at least one $R^5$ is independently a $(C_1-C_{12})$alkyl, which is Signed and Sealed this
Thirteenth Day of July, 2021

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,990,012 B2

Column 31, Claim 6, Line 15 should read: at least one $R^5$ is independently a $(C_1-C_5)$alkyl, which is Column 31, Claim 6, Line 16 should read: independently substituted with 1, 2, or 3 $(C_1-C_5)$ Column 31, Claim 6, Line 18 should read: at least one $R^5$ is independently a $(C_1-C_5)$alkyl, which is